(12) United States Patent
Wen et al.

(10) Patent No.: US 12,429,974 B2
(45) Date of Patent: Sep. 30, 2025

(54) TOUCH DISPLAY PANEL AND TOUCH DISPLAY APPARATUS

(71) Applicant: BOE TECHNOLOGY GROUP CO., LTD., Beijing (CN)

(72) Inventors: Mengyang Wen, Beijing (CN); Guangliang Shang, Beijing (CN); Shiming Shi, Beijing (CN); Hao Liu, Beijing (CN); Li Wang, Beijing (CN); Libin Liu, Beijing (CN); Hui Zhao, Beijing (CN); Chunyan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/251,172

(22) PCT Filed: May 31, 2022

(86) PCT No.: PCT/CN2022/096417
§ 371 (c)(1),
(2) Date: Apr. 28, 2023

(87) PCT Pub. No.: WO2023/230898
PCT Pub. Date: Dec. 7, 2023

(65) Prior Publication Data
US 2024/0353950 A1 Oct. 24, 2024

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0412* (2013.01); *G06F 3/0446* (2019.05); *H10K 59/40* (2023.02); *G06F 2203/04111* (2013.01)

(58) Field of Classification Search
None
See application file for complete search history.

(56) References Cited

U.S. PATENT DOCUMENTS

| 8,947,370 B2 * | 2/2015 | An | G06F 3/0446 345/173 |
| 11,687,201 B2 * | 6/2023 | Lim | G06F 3/0412 345/173 |

(Continued)

FOREIGN PATENT DOCUMENTS

| CN | 104951170 A | 9/2015 |
| CN | 109753182 A | 5/2019 |

(Continued)

*Primary Examiner* — Matthew Yeung
(74) *Attorney, Agent, or Firm* — Dority & Manning, P.A.

(57) ABSTRACT

A touch display panel has a display area and a fan-out area located at a side of the display area. The display area includes a first display region and a second display region located around the first display region. The touch display panel includes a display substrate and a touch function layer. The display substrate has a display side, and the touch function layer is located on the display side of the display substrate. The touch function layer includes a plurality of touch electrodes and a plurality of touch leads. The plurality of touch electrodes are located in the first display region, and the plurality of touch leads are electrically connected to the plurality of touch electrodes and extend to the fan-out area through the second display region.

19 Claims, 19 Drawing Sheets

(56) References Cited

U.S. PATENT DOCUMENTS

| | | | |
|---|---|---|---|
| 11,921,961 B2 * | 3/2024 | Lee | G06F 3/04166 |
| 12,130,979 B2 * | 10/2024 | Kim | G06F 3/04164 |
| 2013/0038542 A1 | 2/2013 | Kim | |

FOREIGN PATENT DOCUMENTS

| | | |
|---|---|---|
| CN | 112419901 A | 2/2021 |
| CN | 113311964 A | 8/2021 |
| CN | 113504846 A | 10/2021 |
| JP | 2014099199 A | 5/2014 |
| KR | 20210081701 A | 7/2021 |

* cited by examiner

TOUCH DISPLAY PANEL AND TOUCH DISPLAY APPARATUS

CROSS-REFERENCE TO RELATED APPLICATION

This application is a national phase entry under 35 USC 371 of International Patent Application No. PCT/CN2022/096417, filed on May 31, 2022, which is incorporated herein by reference in its entirety.

TECHNICAL FIELD

The present disclosure relates to the field of display technologies, and in particular, to a touch display panel and a touch display apparatus.

BACKGROUND

In the related art, a frame width of a touch display panel is generally wide, which affects a visual effect of the touch display panel.

SUMMARY

In an aspect, a touch display panel is provided. The touch display panel has a display area and a fan-out area located at a side of the display area, and the display area includes a first display region and a second display region located around the first display region. The touch display panel includes a display substrate and a touch function layer. The display substrate has a display side, and the touch function layer is located on the display side of the display substrate. The touch function layer includes a plurality of touch electrodes and a plurality of touch leads. The plurality of touch electrodes are located in the first display region, and the plurality of touch leads are electrically connected to the plurality of touch electrodes and extend to the fan-out area through the second display region.

In some embodiments, an absolute value of a length difference between portions, located in the display area, of two touch leads in the plurality of touch leads is in a range of 0 mm to 4 mm, inclusive.

In some embodiments, portions, in the display area, of at least two touch leads in the plurality of touch leads are substantially equal in length.

In some embodiments, the plurality of touch leads each include a first leading-out line and a second leading-out line. A terminal of the first leading-out line is electrically connected to a touch electrode in the plurality of touch electrodes and located in the first display region, and another terminal of the first leading-out line extends to the second display region. A terminal of the second leading-out line is electrically connected to a terminal of the first leading-out line away from the touch electrode, and another terminal of the second leading-out line extends to a boundary between the second display region and the fan-out area; the second leading-out line extends along an extending direction of an edge of the first display region. A sum of lengths of the first leading-out line and the second leading-out line in any one touch lead is a first set length; in the plurality of touch leads, touch leads having a greatest first set length are second touch leads, and remaining touch leads are first touch leads. A first touch lead in the first touch leads further includes a first compensation line, and the first compensation line is located in the second display region and electrically connected to a first leading-out line of the first touch lead and/or a second leading-out line of the first touch lead.

In some embodiments, for the first touch lead, a sum of lengths of the second leading-out line and the first compensation line is a second set length, and an absolute value of a difference between second set lengths of two first touch leads in the first touch leads is in a range of 0 mm to 4 mm, inclusive.

In some embodiments, for the first touch lead, the sum of lengths of the second leading-out line and the first compensation line is the second set length; second set lengths of at least two first touch leads in the first touch leads are substantially equal.

In some embodiments, the first touch leads include a first first touch lead and a second first touch lead, and a first set length of the first first touch lead is greater than a first set length of the second first touch lead. First compensation lines of the first touch leads include a first first compensation line and a second first compensation line, and a length of the first first compensation line is less than a length of the second first compensation line. The first first compensation line is electrically connected to the first first touch lead, and the second first compensation line is electrically connected to the second first touch lead.

In some embodiments, first set lengths of touch leads in the plurality of touch leads increase in a direction away from the display area.

In some embodiments, at least part of an orthographic projection of the first compensation line on the display substrate is located outside orthographic projections of first leading-out lines of the plurality of touch leads on the display substrate and/or orthographic projections of second leading-out lines of the plurality of touch leads on the display substrate.

In some embodiments, for the first touch lead, a terminal of the second leading-out line electrically connected to the first leading-out line is a first connection terminal; for the first touch lead, a terminal of the first compensation line is electrically connected to the first connection terminal, and another terminal of the first compensation line extends along the extending direction of the edge of the first display region and along a direction away from the second leading-out line.

In some embodiments, for first compensation lines of the first touch leads, orthographic projections, on the display substrate, of terminals, which are each away from a respective first connection terminal, of the first compensation lines are substantially flush with each other.

In some embodiments, the touch function layer includes a first conductive layer, a second conductive layer, and an insulating layer. The first conductive layer and the second conductive layer are sequentially arranged, and the insulating layer is located between the first conductive layer and the second conductive layer. The first leading-out line and the second leading-out line are located in the first conductive layer, and the first compensation line is located in the second conductive layer.

In some embodiments, the touch function layer includes a first conductive layer, a second conductive layer and an insulating layer. The first conductive layer and the second conductive layer are sequentially arranged, and the insulating layer is located between the first conductive layer and the second conductive layer. The first leading-out line and the second leading-out line are located in the first conductive layer. The first compensation line includes at least two first compensation sub-lines arranged at intervals and at least one first connection portion. The at least two first compensation sub-lines arranged at intervals are located in the first conductive layer. The at least one first connection portion is located in the second conductive layer. A first connection portion in the at least one first connection portion crosses the first leading-out line and is electrically connected to two adjacent first compensation sub-lines in the at least two first compensation sub-lines through first via holes in the insulating layer.

In some embodiments, the plurality of touch electrodes include a plurality of first touch electrodes and a plurality of second touch electrodes. The plurality of first touch electrodes are arranged at intervals along a first direction and all extend along a second direction intersecting the first direction. The plurality of first touch electrodes are located in the first conductive layer. The plurality of second touch electrodes are arranged at intervals along the second direction and all extend along the first direction. The plurality of second touch electrodes and the plurality of first touch electrodes cross each other and are insulated from each other, so as to constitute a capacitor unit at each crossing position; and a minimum closed pattern region where all capacitor units are located as a whole is the first display region. A second touch electrode in the plurality of second touch electrodes includes a plurality of touch sub-electrodes arranged at intervals and a plurality of bridging portions. The plurality of touch sub-electrodes arranged at intervals are located in the first conductive layer. The plurality of bridging portions are located in the second conductive layer. A bridging portion in the plurality of bridging portions crosses a first touch electrode in the plurality of first touch electrodes and is electrically connected to two adjacent touch sub-electrodes in the plurality of touch sub-electrodes through second via holes in the insulating layer.

In some embodiments, a length of a second leading-out line of a second touch lead in the second touch leads is substantially equal to the second set length; or the second touch lead further includes a second compensation line. The second compensation line is located in the second display region and electrically connected to a first leading-out line of the second touch lead and/or a second leading-out line of the second touch lead. For the second touch lead, a sum of lengths of the second leading-out line and the second compensation line is substantially equal to the second set length.

In some embodiments, the display substrate includes a substrate and a plurality of sub-pixels. The plurality of sub-pixels are located on a side of the substrate and located in the display area. An orthographic projection of at least one touch lead in the plurality of touch leads on the substrate avoids an orthographic projection of a light-emitting region of a sub-pixel in the plurality of sub-pixels on the substrate.

In some embodiments, the display area and the fan-out area are arranged in a third direction, and a direction perpendicular to a thickness direction of the display substrate and intersecting the third direction is a fourth direction. At least part of the plurality of touch leads are distributed on two sides of the first display region in the fourth direction, respectively.

In another aspect, a touch display apparatus is provided. The touch display apparatus includes the touch display panel as described above.

In some embodiments, for each of the plurality of touch leads, a terminal is located in the first display region and electrically connected to a touch electrode in the plurality of touch electrodes, and another terminal of the touch lead away from the touch electrode extends to the fan-out area. Lengths of portions, located in fan-out area, of any two touch leads in the plurality of touch electrodes are substantially equal.

In some embodiments, a first included angle exists between the first leading-out line and an end of the touch electrode proximate to the first leading-out line, and the first included angle is an acute angle.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1A:
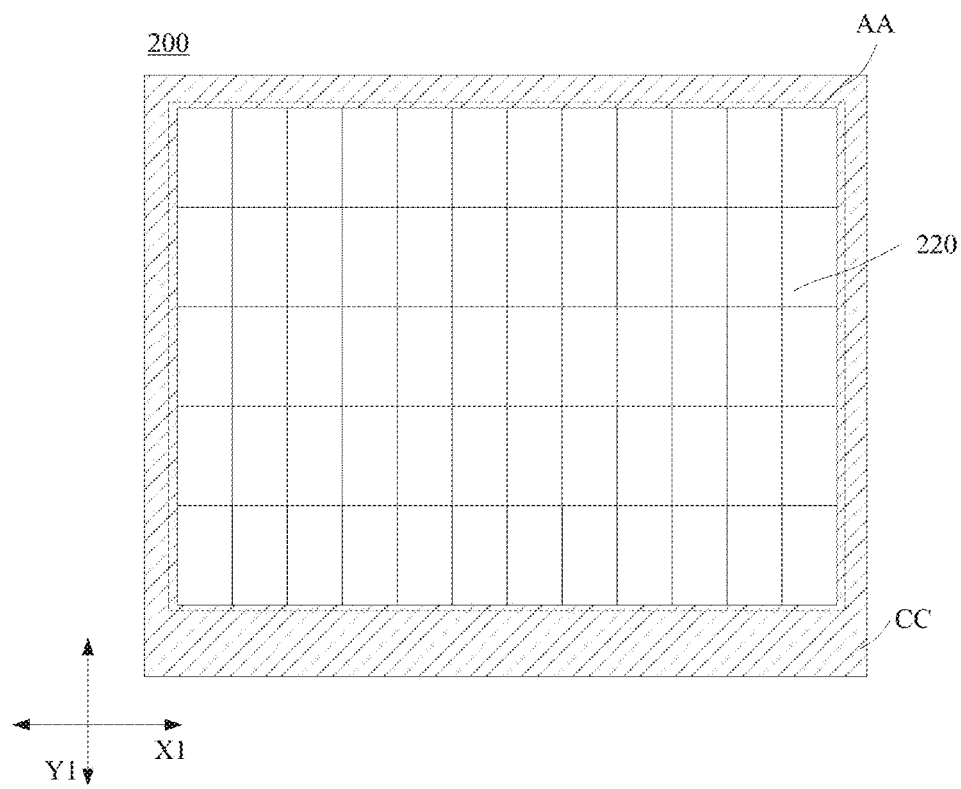
FIG. 1A is a structural diagram of a touch display panel, in accordance with some embodiments.

The technical solutions in some embodiments of the present disclosure will be described clearly and completely below with reference to the accompanying drawings. Obviously, the described embodiments are merely some but not all of embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as a n open and inclusive meaning, i.e., "including, but not limited to". In the description of the specification, the terms such as "one embodiment", "some embodiments", "exemplary embodiments", "example". "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the term "connected" and its derivatives may be used. For example, the term "connected" may be used in the description of some embodiments to indicate that two or more components are in direct physical contact or electrical contact with each other.

The phrase "at least one of A, B and C" has the same meaning as the phrase "at least one of A, B or C", and they both include the following combinations of A, B and C:

only A, only B, only C, a combination of A and B, a combination of A and C, a combination of B and C, and a combination of A, B and C.

The phrase "A and/or B" includes the following three combinations: only A, only B, and a combination of A and B.

As used herein, terms such as "about", "substantially" or "approximately" include a stated value and an average value within an acceptable range of deviation of a particular value. The acceptable range of deviation is determined by a person of ordinary skill in the art in view of the measurement in question and errors associated with the measurement of a particular quantity (i.e., the limitation of the measurement system).

As used herein, terms such as "parallel", "perpendicular" or "equal" include a stated condition and a condition similar to the stated condition. A range of the similar condition is within an acceptable range of deviation, and the acceptable range of deviation is determined by a person of ordinary skill in the art in view of the measurement in question and errors associated with the measurement of a particular quantity (i.e., the limitation of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of approximate equality may be, for example, a difference between two equals being less than or equal to 5% of any one of the two equals.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the drawings, thicknesses of layers and sizes of regions are enlarged for clarity. Variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

FIG. 1A is a structural diagram of a touch display panel, in accordance with some embodiments.

As shown in FIG. 1A, embodiments of the present disclosure provide the touch display panel (touch screen panel, which is abbreviated as TSP) 200. It will be understood that the touch display panel 200 is used for displaying image information. For example, the touch display panel 200 may display still image information, such as a picture or photograph; or the touch display panel 200 may display a dynamic image, such as a video or game image.

With the rapid development of the display technology, the touch display panel 200 has a wide application space in the fields of vehicle-mounted display, mobile phone display, tablet computer display, notebook computer display, television display, etc. It will be understood that the touch display panel 200 has a touch function.

In some examples, the touch display panel 200 is any one of an organic light-emitting diode (OLED) display, a quantum dot light-emitting diode (QLED) display, and a liquid crystal display (LCD).

In some examples, as shown in FIG. 1A, the touch display panel 200 has a display area AA and a peripheral area CC, and the peripheral area CC is disposed around the display area AA. It will be understood that, the display area AA is used for displaying the image information, and the peripheral area CC is used for providing therein with leads or a driving device electrically connected into the display area AA.

In some examples, a shape of the touch display panel 200 may be a square, a circle, or other shape. A shape of the display area AA may be the same as or different from the shape of the touch display panel 200.

In some examples, as shown in FIG. 1A, the touch display panel 200 includes a plurality of sub-pixels 220. The sub-pixel 220 is the smallest unit of the touch display panel 200 for displaying the image. The plurality of sub-pixels 220 are located in the display area AA of the touch display panel 200, and the plurality of sub-pixels 220 are arranged in an array, so that the display area AA can realize an image display function.

In some examples, as shown in FIG. 1A, the plurality of sub-pixels 220 are arranged in a plurality of columns along a first direction X1 and in a plurality of rows along a second direction Y1, and the first direction X1 intersect the second direction Y1. In some examples, the first direction X1 is a horizontal direction, and the second direction Y1 is a vertical direction. For example, the first direction X1 is perpendicular to the second direction Y1.

It will be understood that each sub-pixel 220 may display a single color, such as red, green, or blue. The touch display panel 200 may include red sub-pixels, green sub-pixels and blue sub-pixels. By adjusting the luminance (grayscale) of sub-pixels 220 of different colors, red light, green light and blue light with different intensities may be obtained. At least two of the red light, the green light and the blue light with different intensities are superposed, and thus light of more colors may be displayed. As a result, full-color display of the touch display panel 200 is realized.

Figure 1B:
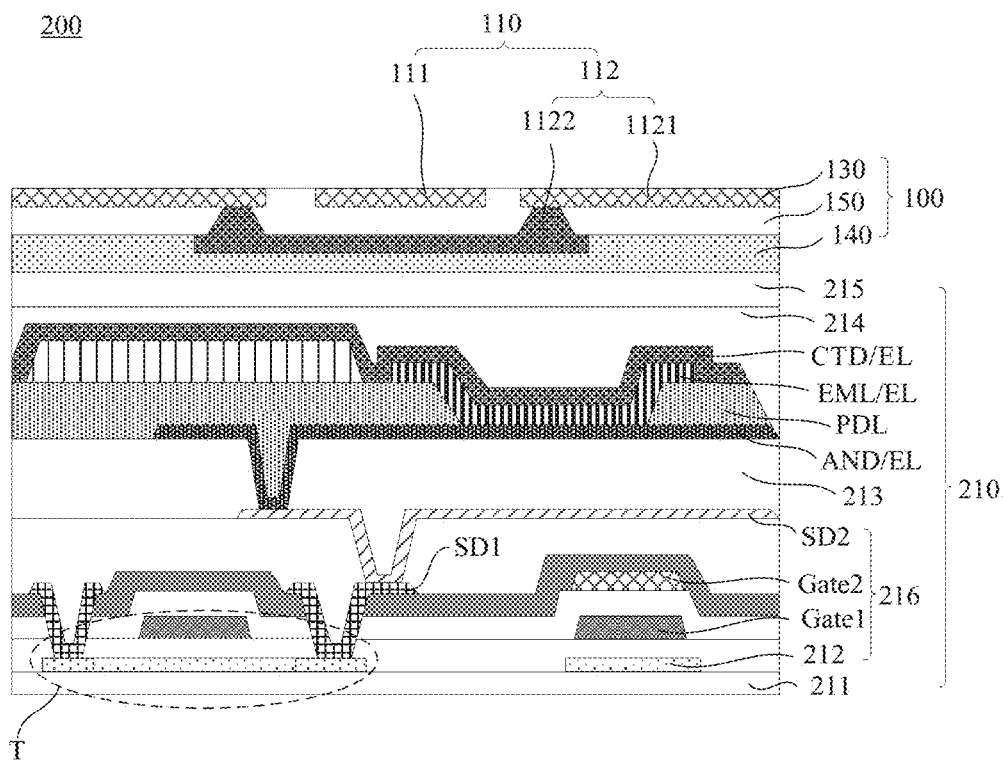
FIG. 1B is another structural diagram of a touch display panel, in accordance with some embodiments.

FIG. 1B is another structural diagram of the touch display panel, in accordance with some embodiments.

As shown in FIG. 1B, the touch display panel 200 includes a display substrate 210 and a touch function layer 100. The display substrate 210 has a display side, and the touch function layer 100 is located on the display side of the display substrate 210.

It will be understood that, the display side of the display substrate 210 is used for displaying the image information; the plurality of sub-pixels 220 are included in the display substrate 210, so that the display substrate 210 can implement the display function. The touch function layer 100 is capable of detecting a touch position. In this way, by arranging the touch function layer 100 on the display side of the display substrate 210, it is possible to enable the touch display panel 200 to realize the touch function.

In some examples, the touch function layer 100 is located in the display area AA of the touch display panel 200, so that the touch function can be realized in the display area AA. For example, the touch function layer 100 is made of a transparent material, so as to prevent the touch function layer 100 from blocking the image information displayed in the display area AA.

With continued reference to FIG. 1B, a structure of the display substrate 210 is illustrated by taking an example in which the display substrate 210 is an OLED display substrate.

In some examples, as shown in FIG. 1B, each sub-pixel 220 includes a light-emitting device EL and a pixel driving circuit, and the pixel driving circuit is electrically connected to the light-emitting device EL, so as to drive the light-emitting device EL to emit light. For example, the pixel driving circuit includes a plurality of thin film transistors (TFTs) T and at least one capacitor.

For example, as shown in FIG. 1B, the display substrate 210 includes a substrate 211 and a plurality of conductive film layers 216, and the pixel driving circuit is disposed in the plurality of conductive film layers 216.

In some examples, the substrate 211 is made of a flexible material such that the display substrate 210 is capable of being bent. As a result, the touch display panel 200 is capable of achieving a function such as curved display, folded display, or rolling display. In some other examples, the substrate 211 is made of a rigid material.

For example, the substrate 211 may be made of any one of polyimide (PI), polycarbonate (PC) or polyvinyl chloride (PVC).

For example, as shown in FIG. 1B, the plurality of conductive film layers 216 are located on a same side of the substrate 211, and the plurality of conductive film layers 216 are sequentially arranged. In some examples, as shown in FIG. 1B, the plurality of conductive film layers 216 include an active film layer 212, a first gate metal layer Gate1, a second gate metal layer Gate2, a first source-drain metal layer SD1, and a second source-drain metal layer SD2 that are away from the substrate 211 in sequence.

For example, the active film layer 212 and the first gate metal layer Gate1 may be used to form part (one, two or more) of the plurality of thin film transistors T, and the active film layer 212 and the second gate metal layer Gate2 may be used to form another part (one, two or more) of the plurality of thin film transistors T. The first gate metal layer Gate1 and the second gate metal layer Gate2 may be used to form at least one capacitor.

In some examples, insulating film layers (which are not shown in the figures, such as a gate insulating layer, a passivation layer and an organic layer) are provided in the plurality of conductive film layers 216, so that two adjacent conductive film layers 216 are electrically isolated.

It will be noted that, the number of active film layers 212 is not further limited in the embodiments of the present disclosure. For example, in some examples of the present disclosure, only one active film layer 212 may be included in the display substrate 210, and a material of the active film layer 212 may include metal oxide or low temperature polysilicon. In some other examples of the present disclosure, two active film layers 212 may also be included in the display substrate 210; a material of one active film layer 212 includes metal oxide, and a material of another active film layer 212 includes low temperature polysilicon.

In some examples, the plurality of conductive film layers 216 may further include a third gate metal layer (not shown in the figures). For example, the first gate metal layer Gate1, the second gate metal layer Gate2, the third gate metal layer, the first source-drain metal layer SD1, and the second source-drain metal layer SD2 are sequentially arranged in the direction away from the substrate 211.

As can be seen from the description above, the pixel driving circuit is electrically connected to the light-emitting device EL, so as to drive the light-emitting device EL to emit light. With continued reference to FIG. 1B, the light-emitting device EL is illustrated below.

In some examples, as shown in FIG. 1B, the light-emitting device EL is located on a side of the plurality of conductive film layers 216 away from the substrate 211. Since the sub-pixel 220 includes the pixel driving circuit located in the plurality of conductive film layers 210 and the light-emitting device EL located on the side of the plurality of conductive film layers 216 away from the substrate 211, the plurality of sub-pixels 220 are located on the side of the substrate 211.

For example, as shown in FIG. 18, the light-emitting device EL includes a portion of an anode layer AND, a portion of a light-emitting functional layer EML, and a portion of a cathode layer CTD that are sequentially arranged in the direction away from the substrate 211.

In some examples, the light-emitting functional layer EML includes a plurality of effective light-emitting portions arranged at intervals. The effective light-emitting portion is used for emitting light. For example, the effective light-emitting portion includes an electroluminescent material. It will be understood that, electroluminescence refers to a phenomenon in which an organic semiconductor material is driven by an electric field to form excitons through carrier injection and transport, and the combination of electrons and holes, and then radiative recombination leads to light emission.

In some examples, as shown in FIG. 1B, the display substrate 210 further includes a pixel define layer PDL. The pixel define layer PDL includes a plurality of opening regions, and an effective light-emitting portion is located in an opening region, so that the plurality of effective light-emitting portions can be arranged at intervals.

It will be understood that, in the plurality of effective light-emitting portions, a part is used for emitting red light, another part is used for emitting green light, and yet another part is used for emitting blue light. For example, different electroluminescent materials may be selected such that the effective light-emitting portions are capable of emitting light of different colors. It will be understood that the number of the effective light-emitting portions emitting red light, the number of the effective light-emitting portions emitting green light, and the number of the effective light-emitting portions emitting blue light may be the same or different.

For example, the effective light-emitting portions emitting red light, the effective light-emitting portions emitting green light, and the effective light-emitting portions emitting blue light may be mixed and arranged in an array. In this way, red light, green light and blue light with different intensities can be obtained by controlling light-emitting intensities of the different effective light-emitting portions. The red light, green light and blue light with different intensities are mixed, so that the touch display panel 200 may realize the full-color image display.

In some examples, one pixel driving circuit is electrically connected to one effective light-emitting portion through a portion of the anode layer AND, so that each pixel driving circuit can provide a driving current to a corresponding effective light-emitting portion through a portion of the anode layer AND. That is, the plurality of effective light-emitting portions can independently emit light. As a result, mutual interference between the plurality of effective light-emitting portions is reduced, and the display effect of the touch display panel 200 is improved. It will be understood that, by adjusting the magnitude of the driving current provided from the pixel driving circuit to the effective light-emitting portion, it is possible to adjust the luminance of the effective light-emitting portion.

In some examples, the anode layer AND is made of a metal material, such as copper or silver. The cathode layer CTD is made of a transparent material (such as transparent indium tin oxide (ITO) or transparent indium zinc oxide (IZO)), so that the light emitted from the effective light-emitting portion can exit through the cathode layer CTD. In this case, the display substrate 210 is a top-emission display substrate.

In some other examples, the anode layer AND is made of the transparent material, such as ITO or IZO. The cathode layer CTD is made of the metal material, such as copper or silver. As a result, the light emitted from the effective light-emitting portion can exit through the anode layer AND. In this case, the display substrate 210 is a bottom-emission display substrate.

In still some other examples, the anode layer AND and the cathode layer CTD are both made of the transparent material (such as ITO or IZO), so that the light emitted from the effective light-emitting portion can be exit through the anode layer AND and the cathode layer CTD. In this case, the display substrate 210 is a double-sided emission display substrate.

Embodiments of the present disclosure are described by taking an example in which the display substrate 210 is the top-emission display substrate. It will be understood that, the touch function layer 100 is located on the display side of the display substrate 210, which means that the touch function layer 100 is located on a side of the cathode layer CTD away from the anode layer AND.

In some examples, at least one of a hole injection layer (HIL), a hole transport layer (HTL), and an electron blocking layer (EBL) is disposed between the anode layer and the effective light-emitting portion in a direction directed from the anode layer AND to the effective light-emitting portion. At least one of an electron injection layer (EIL), an electron transport layer (ETL), and a hole blocking layer (HBL) is disposed between the cathode layer CTD and the effective light-emitting portion in a direction directed from the cathode layer CTD to the effective light-emitting portion. The arrangements above improve the light-emitting reliability of the effective light-emitting portion.

In some examples, as shown in FIG. 1B, the display substrate 210 further includes a planarization layer 213. The planarization layer 213 is located between the plurality of conductive film layers 216 and the light-emitting device EL. That is, the light-emitting device EL is located on a side of the planarization layer 213 away from the plurality of conductive film layers 216. It will be understood that a surface of the planarization layer 213 away from the plurality of conductive film layers 216 is a smooth or approximately smooth plane.

In some examples, in addition to pixel driving circuits, the plurality of conductive film layers 216 further includes a plurality of signal leads (such as data lines and power supply signal lines). Signal leads are electrically connected to the pixel driving circuit and the light-emitting device EL and used for transmitting electric signals, so that the pixel driving circuit can drive the light-emitting device EL to emit light. As a result, different grayscales are displayed.

In some examples, as shown in FIG. 1B, the display panel 210 further includes an encapsulation layer 214. The encapsulation layer 214 is located on a side of the light-emitting device EL away from the substrate 211. It will be understood that, the encapsulation layer 214 can cover the light-emitting device EL, so as to wrap the light-emitting device EL, which prevents water vapor and oxygen in the external environment from entering the light-emitting device EL, and plays a role of protecting the light-emitting device EL.

Figure 1C:
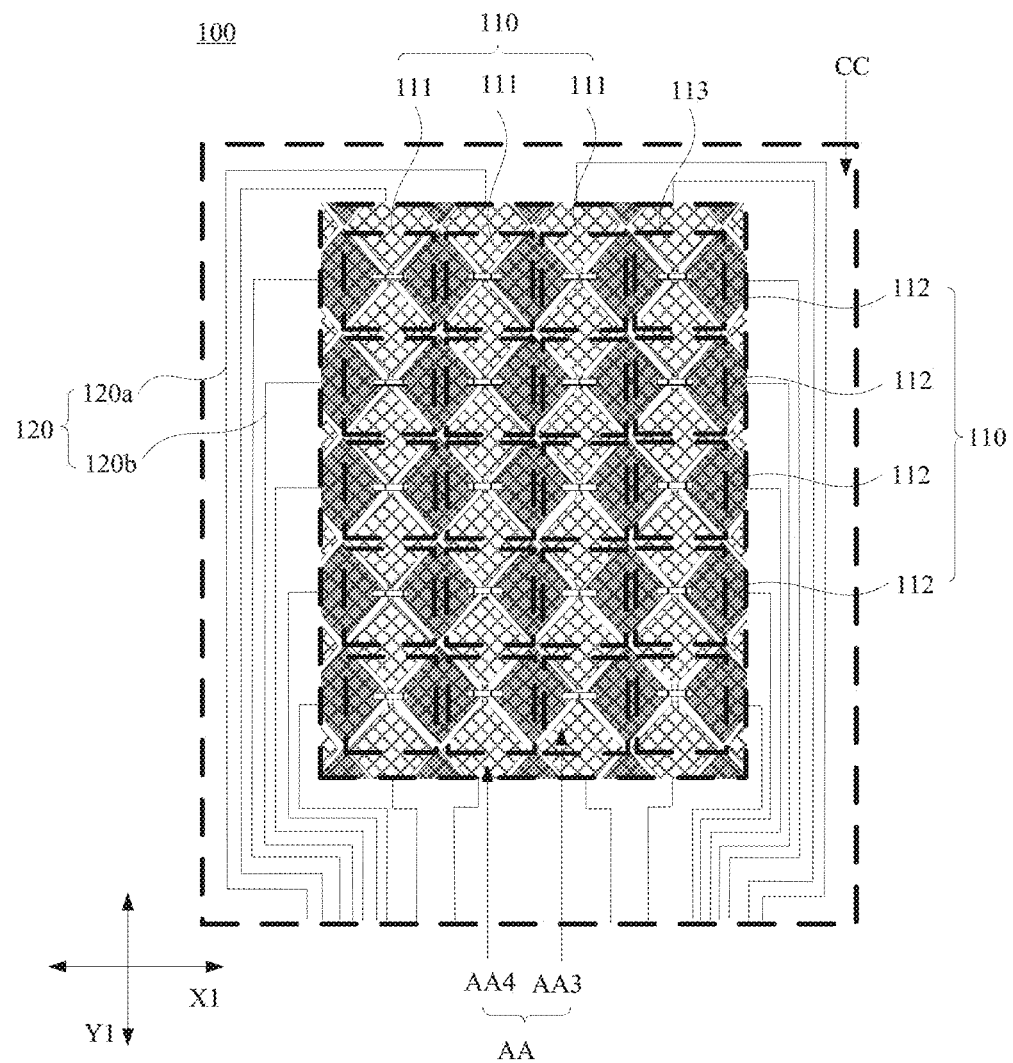
FIG. 1C is a structural diagram of a touch function layer, in accordance with some embodiments.
Figure 1D:
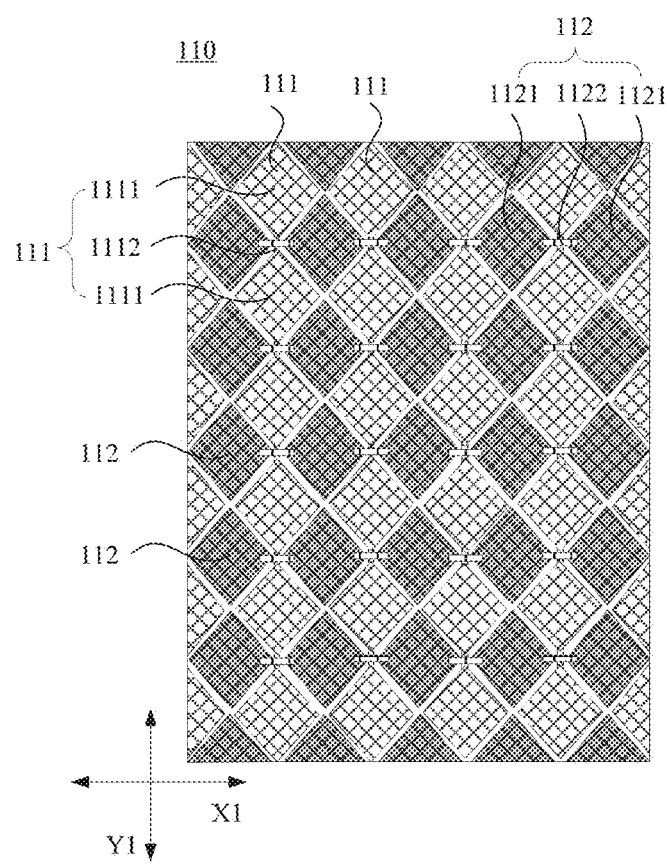
FIG. 1D is a structural diagram of an electrode plate, in accordance with some embodiments.

FIG. 1C is a structural diagram of the touch function layer, in accordance with some embodiments; FIG. 1D is a structural diagram of an electrode plate, in accordance with some embodiments. Referring to FIGS. 1C and 1D, the touch function layer 100 is illustrated below.

In some examples, as shown in FIG. 1C, the touch function layer 100' includes a plurality of touch electrodes 110 and a plurality of touch leads 120. The plurality of touch leads 120 are electrically connected to the plurality of touch electrodes 110.

For example, the touch electrodes 110 are metal mesh touch electrodes, and thus the touch display panel 200 is a metal mesh touch screen panel (TSP).

For example, as shown in FIG. 1C, the plurality of touch electrodes 110 include a plurality of first touch electrodes 111 and a plurality of second touch electrodes 112. The plurality of first touch electrodes 111 are arranged at intervals along the first direction X1, and all extend along the second direction Y1 that intersects the first direction X1. It will be understood that the plurality of first touch electrodes 111 arranged along the first direction X1 are insulated from each other.

For example, as shown in FIG. 1C, the plurality of second touch electrodes 112 are arranged at intervals along the second direction Y1, and all extend along the first direction X1. It will be understood that the plurality of second touch electrodes 112 arranged along the second direction Y1 are insulated from each other. For example, the first direction X1 is perpendicular to the second direction Y1.

In some examples, the first touch electrode 111 is a touch transmitting electrode (Tx), and the second touch electrode 112 is a touch receiving electrode (Rx). In some other examples, the first touch electrode 111 is a touch receiving electrode (Rx) and the second touch electrode 112 is a touch transmitting electrode (Tx).

In some examples, as shown in FIG. 1C, edges of a minimum closed pattern region where the plurality of first touch electrodes 111 and the plurality of second touch electrodes 112 are located as a whole coincides with edges of the display area AA.

For example, as shown in FIG. 1D, the plurality of second touch electrodes 112 and the plurality of first touch electrodes 111 cross each other and are insulated from each other. It will be understood that, the plurality of second touch electrodes 112 and the plurality of first touch electrodes 111 crossing each other means that an orthographic projection of the plurality of first touch electrodes 111 on the display substrate 210 and an orthographic projection of the plurality of second touch electrodes 112 on the display substrate 210 cross each other.

It will be understood that, as shown in FIG. 1C, since the plurality of first touch electrodes 111 and the plurality of second touch electrodes 112 cross each other and are insulated from each other, a capacitor unit 113 (i.e., a touch pattern) may be formed at each crossing position between the plurality of first touch electrodes 111 and the plurality of second touch electrodes 112. For example, a plurality of capacitor units 113 are located in the display area AA and arranged in an array.

In some examples, the capacitor unit 113 is in a shape of a square or approximately square. For example, side lengths of the square capacitor unit 113 may be 4 mm.

It will be understood that, when the capacitor unit 113 is touched by a human finger or a stylus, a capacitance of the human finger or the stylus is superposed to the corresponding capacitor unit 113, so that a capacitance of the capacitor unit 113 is changed. In this way, by obtaining capacitance values of the plurality of capacitor units 113, the touch position may be determined, thereby implementing the touch function.

It will be understood that, the plurality of touch electrodes 110 and the plurality of touch leads 120 are electrically connected, and the plurality of touch electrodes 110 can constitute the capacitor units 113. Therefore, the plurality of touch leads 120 can be electrically connected to the capacitor units 113.

Figure 1E:
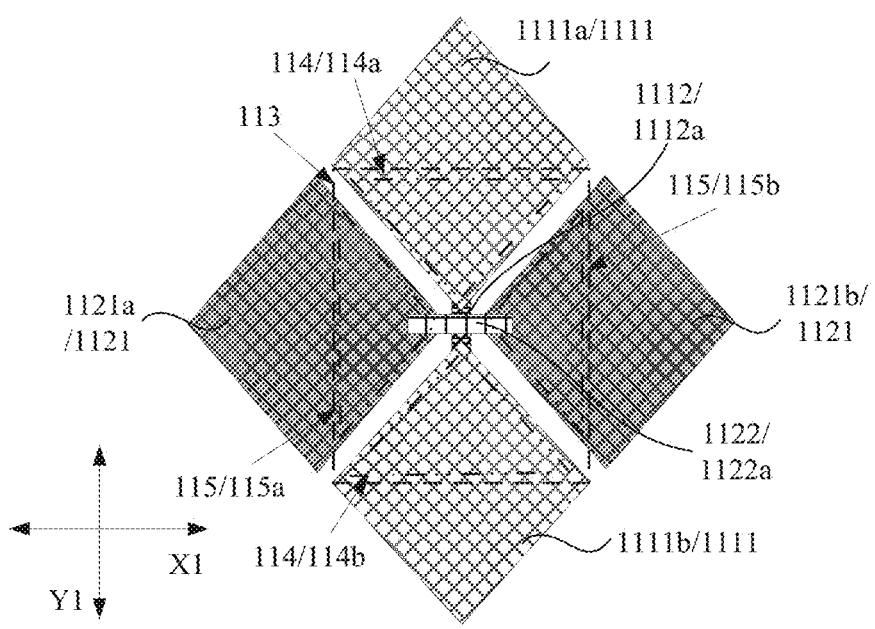
FIG. 1E is a structural diagram of a capacitor unit, in accordance with some embodiments.

FIG. 1E is a structural diagram of the capacitor unit, in accordance with some embodiments. Referring to FIGS. 1D and 1E, the touch electrode is illustrated below.

For example, as shown in FIGS. 1D and 1E, the first touch electrode 111 includes a plurality of touch structures 1111 and a plurality of connecting structures 1112. The plurality of touch structures 1111 are arranged at intervals along the second direction Y1, and the connecting structure 1112 is located between any two adjacent touch structures 1111 and electrically connected to the two adjacent touch structures 1111, so that the first touch electrode 111 can extend along the second direction Y1.

For example, as shown in FIG. 1E, any one touch structure 1111 includes a first portion 114, and first portions 114 of any two adjacent touch structures 1111 are arranged oppositely. In some examples, the touch structure 1111 may include two first portions 114. Shapes of the two first portions 114 are the same, and areas of the two first portions 114 are the same.

For example, as shown in FIG. 1E, the second touch electrode 112 includes a plurality of touch sub-electrodes 1121 and a plurality of bridging portions 1122. The plurality of touch sub-electrodes 1121 are arranged at intervals along the first direction X1, and a bridging portion 1122 is located between any two adjacent touch sub-electrodes 1121 and electrically connected to the two adjacent touch sub-electrodes 1121, so that the second touch electrode 112 can extend along the first direction X1.

For example, as shown in FIG. 1E, any one touch sub-electrode 1121 includes a second portion 115, and second portions 115 of any two adjacent touch sub-electrodes 1121 are arranged oppositely. In some examples, the touch sub-electrode 1121 may include two second portions 115. Shapes of the two second portions 115 are the same, and areas of the two second portions 115 are the same.

For example, as shown in FIG. 1E, an orthographic projection of the connecting structure 1112a on the display substrate 210 intersects an orthographic projection of the bridging portion 1122a on the display substrate 210. It will be noted that, the connecting structure 1112a and the bridging portion 1122a are only used to define a connecting structure 1112 and a bridging portions 1122 whose orthographic projections on the display substrate 210 intersect, and the connecting structure 1112 and the bridging portion 1122 are not further limited.

As shown in FIG. 1E, the plurality of touch structures 1111 include a first touch structure 1111a and a second touch structure 1111b that are disposed adjacently, and the connecting structure 1112a is located between the first touch structure 1111a and the second touch structure 1111b and electrically connected to the first touch structure 1111a and the second touch structure 1111b.

It will be noted that, the first touch structure 1111a and the second touch structure 1111b are only used for distinguishing two touch structures 1111 that are electrically connected to the connecting structure 1112a and disposed adjacently, and the touch structures 1111 are not further limited.

As shown in FIG. 1E, the plurality of touch sub-electrodes 1121 include a first touch sub-electrode 1121a and a second touch sub-electrode 1121b, and the bridging portion 1122a is located between the first touch sub-electrode 1121a and the second touch sub-electrode 1121b and electrically connected to the first touch sub-electrode 1121a and the second touch sub-electrode 1121b.

It will be noted that, the first touch sub-electrode 1121*a* and the second touch sub-electrode 1121*b* are only used for distinguishing two touch sub-electrodes 1121 that are electrically connected to the bridging portion 1122*a* and are disposed adjacently, and the touch sub-electrodes 1121 are not further limited.

For example, as shown in FIG. 1E, the first portion 114*a* of the first touch structure 1111*a* and the first portion 114*b* of the second touch structure 1111*b* are arranged oppositely, and the second portion 115*a* of the first touch sub-electrode 1121*a* and the second portion 115*b* of the second touch sub-electrode 1121*b* are disposed oppositely. The first portion 114*a* of the first touch structure 1111*a*, the first portion 114*b* of the second touch structure 1111*b*, the second portion 115*a* of the first touch sub-electrode 1121*a*, the second portion 115*b* of the second touch sub-electrode 1121*b*, the connecting structure 1112*a* and the bridging portion 1122*a* can together constitute the capacitor unit 113.

It will be noted that, the first portion 114*a* and the first portion 114*b* are only used for distinguishing a first portion 114 of the first touch structure 1111*a* from a first portion 114 of the second touch structure 1111*b*, and the first portions 114 are not further limited; the second portion 115*a* and the second portion 115*b* are only used for distinguishing a second portion 115 of the first touch sub-electrode 1121*a* from a second portion 115 of the second touch sub-electrode 1121*b*, and the second portions 115 are not further limited.

As can be seen from the description above, the plurality of touch electrodes 110 and the plurality of touch leads 120 are electrically connected. In some examples, as shown in FIG. 1C, the plurality of touch leads 120 include first-type touch leads 120*a* and second-type touch leads 120*b*.

For example, a plurality of first-type touch leads 120*a* are provided, and at least one first-type touch lead 120*a* is electrically connected to one first touch electrode 111. In some examples, as shown in FIG. 1C, two first-type touch leads 120*a* are electrically connected to two ends of the same first touch electrode 111 in the second direction Y1, respectively. In some other examples, one first-type touch lead 120*a* is electrically connected to an end of one first touch electrode 111 in the second direction Y1.

For example, a plurality of second-type touch leads 120*b* are provided, and at least one second-type touch lead 120*b* is electrically connected to one second touch electrode 112. In some examples, as shown in FIG. 1C, two second-type touch leads 120*b* are electrically connected to two ends of the same second touch electrode 112 in the first direction X1, respectively. In some other examples, one second-type touch lead 120*b* is electrically connected to an end of one second touch electrode 112 in the first direction X1.

It will be noted that, the first-type touch lead 120*a* and the second-type touch lead 120*b* are only used for distinguishing a touch lead 120 electrically connected to the first touch electrode 111 and a touch lead 120 electrically connected to the second touch electrode 112, and the touch leads 120 are not further limited.

In some examples, as shown in FIG. 1C, the plurality of touch electrodes 110 are located in the display area AA, and the plurality of touch leads 120 are located in the peripheral area CC.

For example, the plurality of touch electrodes 110 may be made of transparent indium tin oxide (ITO), transparent indium zinc oxide (IZO) or the like, which reduces the influence of the touch electrodes 110 on the image information displayed in the display area AA.

It will be understood that, as a size resolution (pixels per inch, which is abbreviated as PPI) of the touch display panel 200 is higher and higher, the number of leads (e.g., the touch leads 120, the power supply signal lines, or other leads) required to be arranged in the peripheral area CC of the touch display panel 200 is more and more, resulting in an increase of a width of the peripheral area CC. Therefore, a width of frames (such as frames on both sides in the first direction X1 and frames on both sides in the second direction Y1) of the touch display panel 200 is increased, which is not conducive to the narrow frame of the touch display panel 200, and affects the visual effect of the touch display panel 200.

Figure 2A:
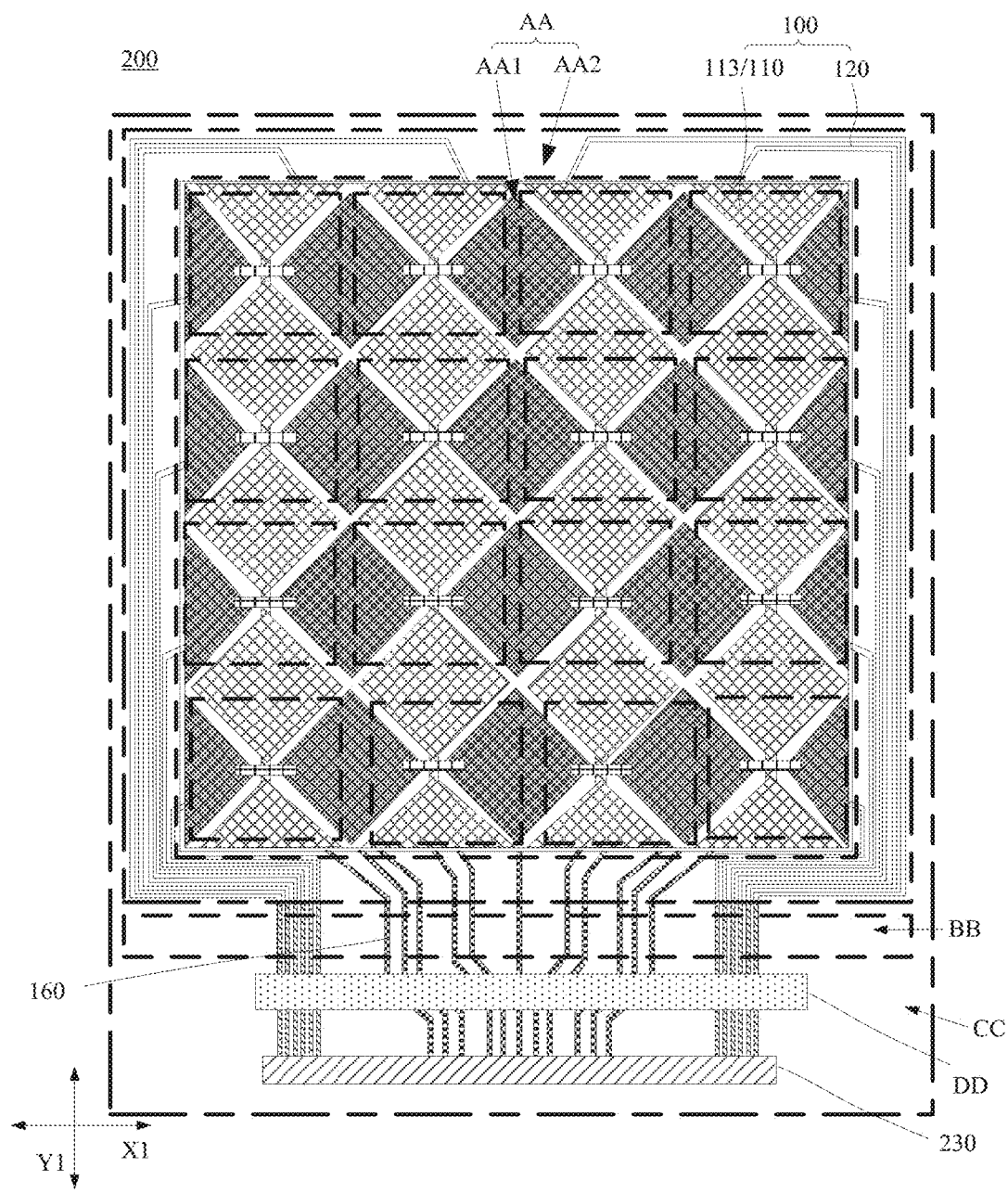
FIG. 2A is yet another structural diagram of a touch display panel, in accordance with some embodiments.

FIG. 2A is yet another structural diagram of the touch display panel, in accordance with some embodiments.

In light of this, the touch display panel 200 is provided in embodiments of the present disclosure. Referring to FIG. 2A, the touch display panel 200 provided in embodiments of the present disclosure is illustrated below.

In some embodiments, referring to FIG. 2A, the touch display panel 200 has the display area AA and a fan-out area BB located at a side of the display area. It will be understood that, the display area AA is used for displaying the image information, and the fan-out area BB is used for providing therein with leads electrically connected into the display area AA.

In some examples, the fan-out area BB is located below the display area AA in using states of the touch display panel 200. That is, the fan-out area BB may be closer to the ground than the display area AA in some using states.

As can be seen from the description above, the peripheral area CC of the touch display panel 200 is disposed around the display area AA. For example, as shown in FIG. 2A, the fan-out area BB is located in the peripheral area CC of the touch display panel 200.

As shown in FIG. 2A, the display area AA includes a first display region AA1 and a second display region AA2 located around the first display region AA1. It will be understood that, both the first display region AA1 and the second display region AA2 can display the image information.

The second display region AA2 is located around the first display region AA1. For example, as shown in FIG. 2A, edges of the second display region AA2 proximate to the first display region AA1 coincide with edges of the first display region AA1 proximate to the second display region AA2, so that the second display region AA2 can be disposed around the first display region AA1 and adjacent to the first display region AA1.

The fan-out area BB is located at the side of the display area AA. In some examples, the fan-out area BB is disposed adjacent to the second display region AA2. For example, an edge of the fan-out area BB proximate to the second display region AA2 coincides with an edge of the second display region AA2 proximate to the fan-out area BB.

It will be noted that, considering FIG. 2A in the drawings of the present disclosure as an example, the edge of the fan-out area BB and the edge of the second display region AA2 are separated from each other, which is only for convenience of illustrating the fan-out area BB and the second display region AA2, and the fan-out area BB and the second display region AA2 are not further limited.

The touch display panel 200 includes the display substrate 210 and the touch function layer 100. The display substrate 210 has the display side, and the touch function layer 100 is located on the display side of the display substrate 210. The touch function layer 100 includes a plurality of touch electrodes 110 and a plurality of touch leads 120, and the plurality of touch leads 120 are electrically connected to the plurality of touch electrodes 110.

It will be understood that, the embodiments of the present disclosure have illustrated the display substrate 210, the touch electrodes 110, and an electrical connection relationship between the plurality of touch leads 120 and the plurality of touch electrodes 110, which will not be repeated here.

As shown in FIG. 2A, the plurality of touch electrodes 110 are located in the first display region AA1, and the plurality of touch leads 120 extend to the fan-out area BB through the second display region AA2.

It will be understood that, the plurality of touch electrodes 110 are located in the first display region AA1, so that the touch function can be implemented in the first display region AA1. The plurality of touch leads 120 are electrically connected to the plurality of touch electrodes 110. For example, as shown in FIG. 2A, for each of the plurality of touch leads 120, a terminal is located in the first display region AA1 and electrically connected to a touch electrode 110, and another terminal extends to the fan-out area BB through the second display region AA2.

It will be understood that, by arranging the plurality of touch leads 120 to extend to the fan-out area BB through the second display region AA2, it may be possible to avoid the touch leads 120 from occupying a space in the peripheral area CC, and reduce the width of the peripheral area CC of the touch display panel 200. As a result, the width of side frames (e.g., the frames on both sides in the first direction X1 and the frames on both sides in the second direction Y1) of the touch display panel 200 can be reduced, which helps realize the narrow frame of the touch display panel 200, maximizes the display area AA of the touch display panel 200, and minimizes the peripheral area CC, thereby improving the visual effect of the touch display panel 200.

In the examples, the plurality of touch leads 120 are arranged to extend to the fan-out area BB through the second display region AA2, so that both sides of the touch display panel 200 in the first direction X1 and a side of the touch display panel 200 away from the fan-out area BB can be frameless. As a result, the visual effect of the touch display panel 200 is improved.

In addition, in the embodiment of the present disclosure, the plurality of touch electrodes 110 are located in the first display region AA1, and the plurality of touch leads 120 extend to the fan-out area BB through the second display region AA2, so that the mutual influence between the touch leads 120 and the touch electrodes 110 is reduced. As a result, the reliability of the touch display panel 200 is improved.

As can be seen from the description above, the plurality of first touch electrodes 111 and the plurality of second touch electrodes 112 cross each other and are insulated from each other, so that a capacitor unit 113 can be constituted at each crossing position. For example, as shown in FIG. 2A, the plurality of capacitor units 113 can be arranged in the array along the first direction X1 and the second direction Y1. Capacitor units 113 arranged along the first direction X1 are electrically connected, and capacitor units 113 arranged along the second direction Y1 are electrically connected.

Figure 2B:
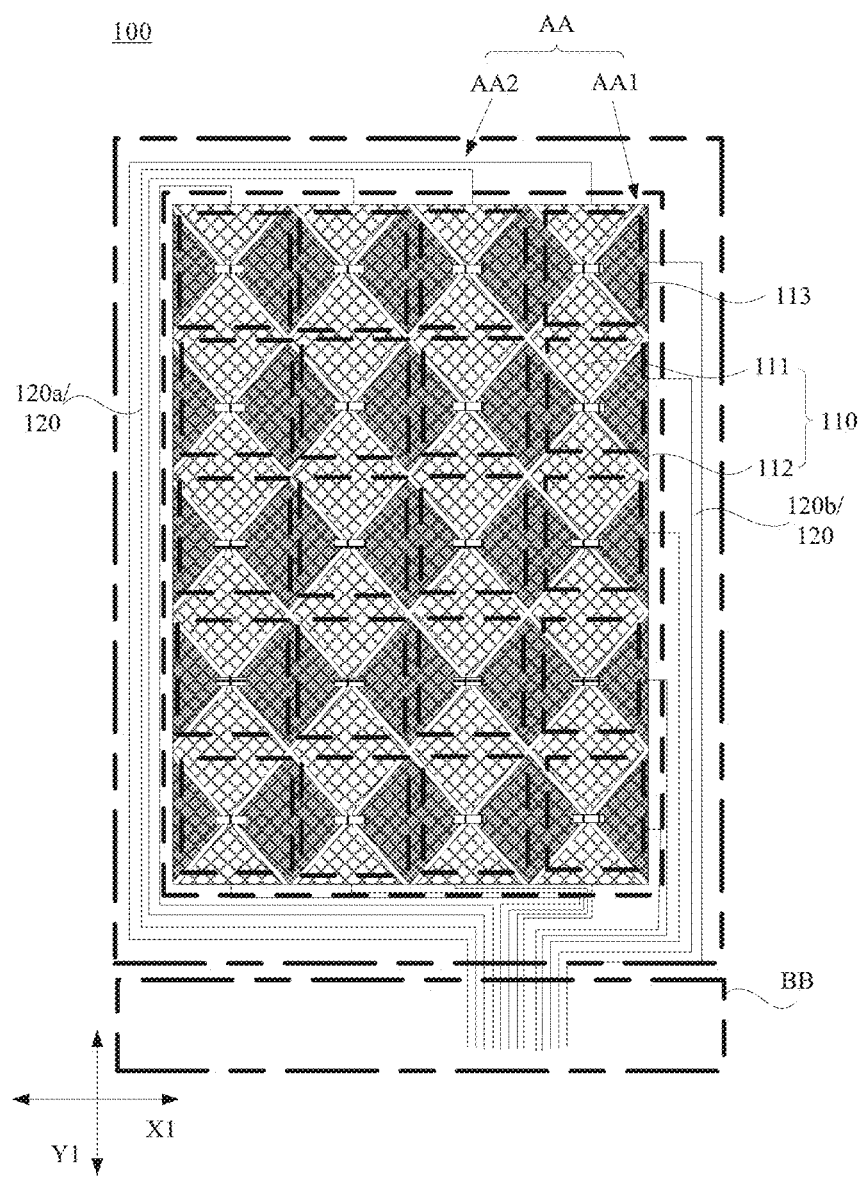
FIG. 2B is another structural diagram of a touch function layer, in accordance with some embodiments.

FIG. 2B is another structural diagram of the touch function layer, in accordance with some embodiments.

As can be seen from the description above, as shown in FIG. 2B, the plurality of touch electrodes 110 include a plurality of first touch electrodes 111 and a plurality of second touch electrodes 112. Part (two or more) of the plurality of touch leads 120 are electrically connected to the first touch electrodes 111, and other part (two or more) of the plurality of touch leads 120 are electrically connected to the second touch electrodes 112.

For example, as shown in FIG. 2B, the first-type touch lead 120a electrically connected to the first touch electrode 111 extends to the fan-out area BB through portions of the second display region AA2 located at two sides of the first display region AA1 in the second direction Y1 and a portion of the second display region AA2 located at one side of the first display region AA1 in the first direction X1. Alternatively, the first-type touch lead 120a electrically connected to the first touch electrode 111 extends to the fan-out area BB through a portion of the second display region AA2 that is located at a side of the first display region AA1 in the second direction Y1 and close to the fan-out area BB.

For example, as shown in FIG. 2B, the second-type touch lead 120b electrically connected to the second touch electrode 112 extends to the fan-out area BB through a portion of the second display region AA2 located at a side of the first display region AA1 in the first direction X1 and the portion of the second display region AA2 that is located at the side of the first display region AA1 in the second direction Y1 and close to the fan-out area BB.

In some examples, the touch lead 120 may be made of transparent indium tin oxide (ITO) or transparent indium zinc oxide (IZO), thereby reducing the influence of the touch lead 120 on image information displayed in the second display region AA2.

In some examples, as shown in FIG. 2A, the touch display panel 200 further includes a connecting area 230, and the connecting area 230 is located in the peripheral area CC. For example, the connecting area 230 is located on a side of the fan-out area BB away from the display region AA. A plurality of connecting pins (not shown in the figure) are provided in the connecting area 230. The touch lead 120 extends to the connecting area 230 and is electrically connected to the connecting pin in the connecting area 230.

For example, a flexible printed circuit (FPC) board (not shown in the figure) outside the touch display panel 200 can be bonded to connecting pins in the connecting area 230. The flexible printed circuit board is mounted with a touch integrated circuit (which is abbreviated as IC and not shown in the figure). The touch IC can obtain capacitance values of the plurality of touch electrodes 110 (i.e., the capacitance values of the plurality of capacitor units 113) through the flexible printed circuit board and the touch leads 120, so that the touch IC can determine the touch position according to the capacitance values of the plurality of capacitor units 113. For example, the touch IC is mounted on the flexible printed circuit board by using a chip on film (COF) process.

In some examples, as shown in FIG. 2A, the touch display panel 200 further includes a plurality of data lines 160. For example, for each of the plurality of data lines 160, a terminal is electrically connected to multiple sub-pixels 220, and another terminal is electrically connected to a connecting pin in the connecting area 230. A driver IC (not shown in FIG. 2A) outside the touch display panel 200 is electrically connected to the plurality of data lines 160 through connecting pins in the connecting area 230. Thus, the driver IC can output data signals to the sub-pixels 220 through the plurality of data lines 160, thereby driving the sub-pixels 220 to emit light.

In some examples, the driver IC is mounted, by using a COF process, on the flexible printed circuit board that is bonded in the connecting area 230.

In some examples, a terminal of the flexible printed circuit board away from the connecting area 230 is electrically connected to a main control circuit board.

In some examples, as shown in FIG. 2A, the touch display panel 200 further has a bending area DD, and the bending area DD is located in the peripheral area CC. For example, the bending area DD is located between the fan-out area BB and the connecting area 230.

It will be understood that, the bending area DD can be bent towards a direction away from the display side, so that the connecting area 230 can be located on a back side of the display substrate 210 (i.e., a side of the display substrate 210 away from the display side). As a result, it may be possible to avoid the connecting area 230, the flexible printed circuit board that is bonded in the connecting area 230, and the like from occupying a space of the display side of the display substrate 210, and reduce a width of a lower frame (a frame close to the fan-out area BB) of the touch display panel 200, thereby improving the visual effect of the touch display panel 200.

Figure 2C:
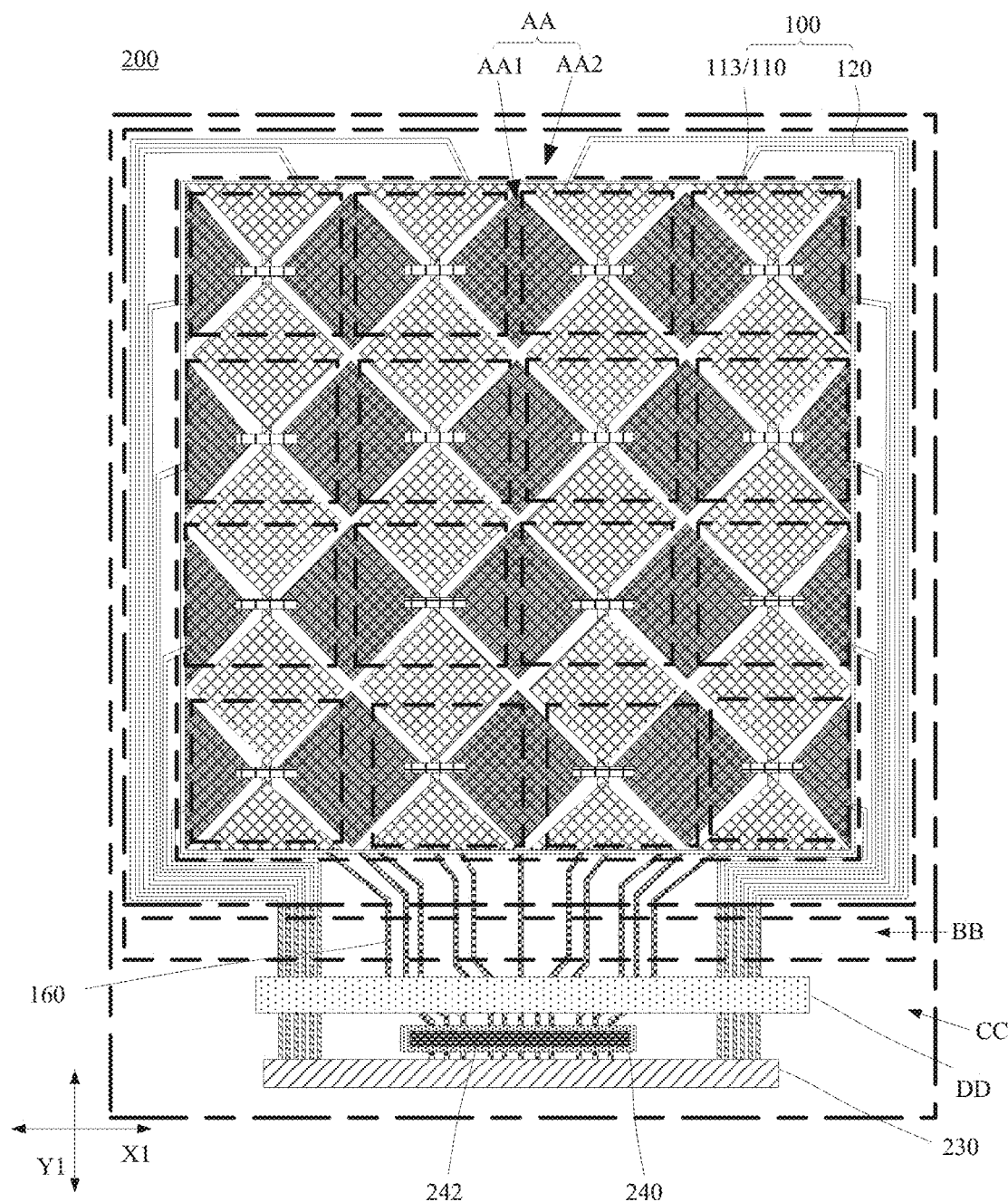
FIG. 2C is yet another structural diagram of a touch display panel, in accordance with some embodiments.

FIG. 2C is yet another structural diagram of the touch display panel, in accordance with some embodiments.

As can be seen from the description above, in some examples, the driver IC is mounted, by using the COF process, on the flexible printed circuit board that is bonded in the connecting area 230. In some other examples, as shown in FIG. 2C, the touch display panel 200 further includes a bonding area 240. The bonding area 240 is located in the peripheral area CC and between the connecting area 230 and the bending area DD. The driver IC (referring to the mark number 242 in FIG. 2C) is bonded, by using a chip on panel (COP) process, on the substrate 211 of the display substrate 210 located in the bonding area 240.

For example, the plurality of data lines 160 are electrically connected in the bonding area 240. Thus, the driver IC can output the data signals to the sub-pixels 220 through the plurality of data lines 160, thereby driving the sub-pixels 220 to emit light.

For example, as shown in FIG. 2A, the plurality of data lines 160 approach and are gathered in the fan-out area BB. That is, a distance between at least two data lines 160 in the plurality of data lines 160 gradually decreases in the fan-out area BB.

In some examples, as shown in FIG. 2A, in the fan-out area BB, the plurality of touch leads 120 are located at two sides of the plurality of data lines 160. With such an arrangement, a length of the touch lead 120 is shortened, so that the resistance of the touch lead 120 is reduced, and the load of the touch lead 120 is reduced. As a result, the transmission reliability of the signal on the touch lead 120 is improved.

As can be seen from the description above, in the embodiment of the present disclosure, the touch electrodes 110 are arranged in the first display region AA1, and the touch leads 120 are arranged to extend to the fan-out area BB through the second display region AA2, so that the touch leads 120 are avoided from occupying the space of the peripheral area CC of the touch display panel 200. As a result, it is possible to reduce the width of the peripheral area CC, and facilitate the realization of the narrow frame of the touch display panel 200, thereby improving the visual effect of the touch display panel 200.

In addition, the touch leads 120 are arranged to extend to the fan-out area BB through the second display region AA2, and the touch electrodes 110 are located in the first display region AA1, which reduces the mutual influence between the touch leads 120 and the touch electrodes 110, and improves the touch performance of the touch function layer 100 on the basis of realizing the narrow frame of the touch display panel 200, thereby improving the use performance of the touch display panel 200.

Moreover, since the touch leads 120 are relatively thin, and the touch leads 120 are arranged in the second display region AA2, there is a relatively small influence on the image information displayed in the second display region AA2. As a result, the risk that the touch leads 120 are observed by naked eyes is reduced, thereby improving the display performance of the touch display panel 200.

Furthermore, the touch leads 120 are arranged to extend to the fan-out area BB through the second display region AA2, so that the process is simple, and the implementation is easy. As a result, the production efficiency of the touch display panel 200 is improved, and the cost of the touch display panel 200 is reduced.

Figure 2D:
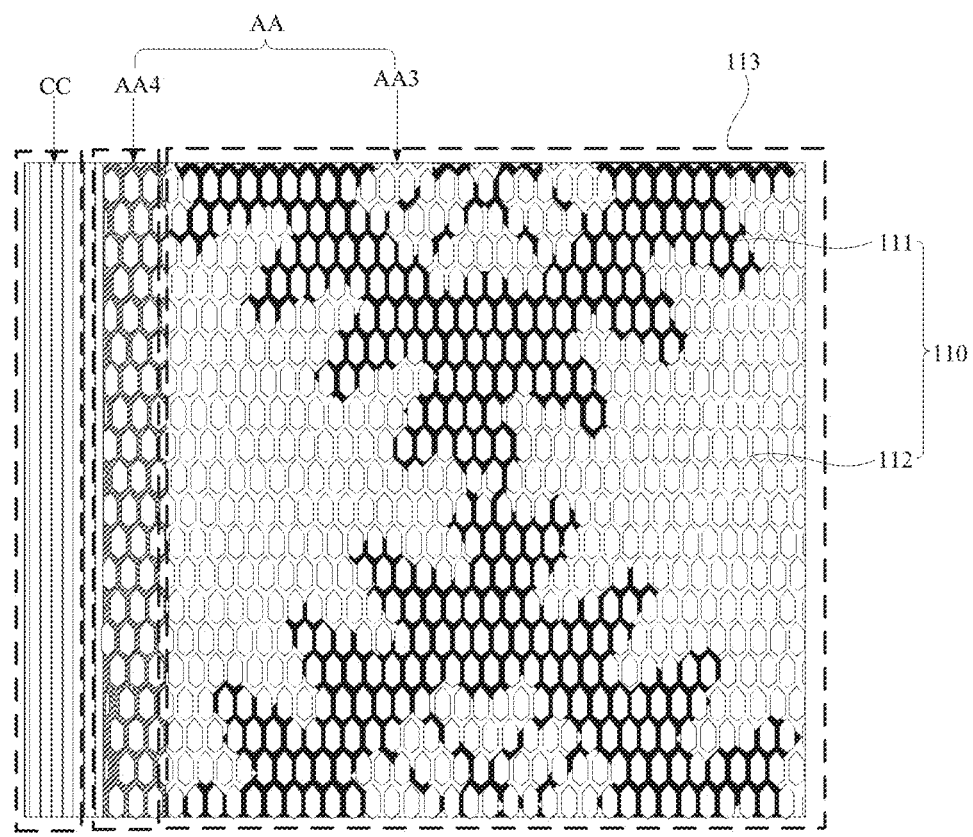
FIG. 2D is a diagram showing a positional relationship between a touch effective region and a display area, in accordance with some embodiments.
Figure 2E:
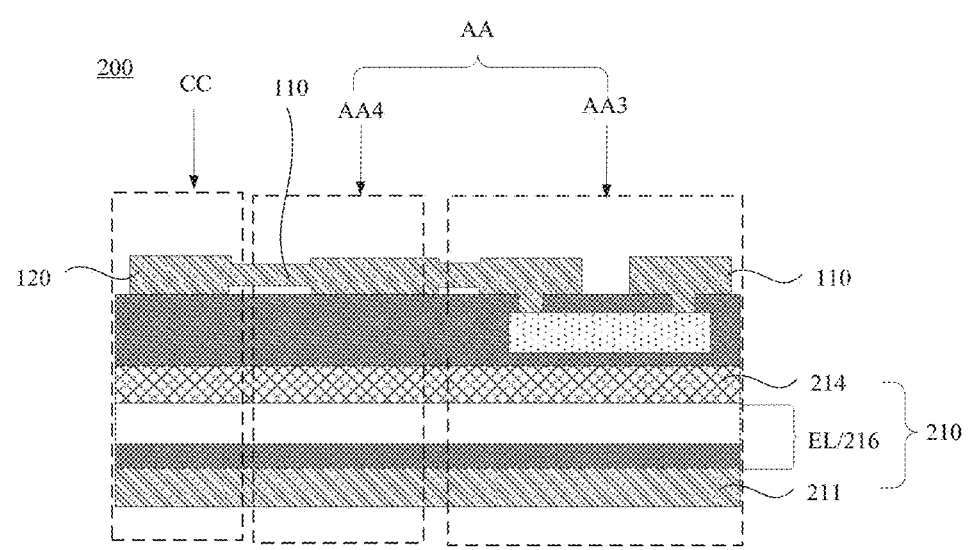
FIG. 2E is yet another structural diagram of a touch display panel, in accordance with some embodiments.

FIG. 2D is a diagram showing a positional relationship between a touch effective region and the display area, in accordance with some embodiments; FIG. 2E is yet another structural diagram of the touch display panel, in accordance with some embodiments.

As can be seen from the description above, the plurality of touch electrodes 110 include the plurality of first touch electrodes 111 and the plurality of second touch electrodes 112. The plurality of first touch electrodes 111 are arranged at intervals along the first direction X1, and all extend along the second direction Y1 which intersects the first direction X1. The plurality of second touch electrodes 112 are arranged at intervals along the second direction Y1, and all extend along the first direction X1. The plurality of second touch electrodes 112 and the plurality of first touch electrodes 111 cross each other and are insulated from each other, so as to constitute a capacitor unit 113 at each crossing position.

For example, as shown in FIG. 1C, the plurality of touch electrodes 110 can constitute the plurality of capacitor units 113, and the edges of the minimum closed pattern region where the touch electrodes 110 are located as a whole coincides with the edges of the display area AA.

It will be understood that, as shown in FIG. 1C, the capacitor unit 113 is in the shape of the square or approximately square, and the edges of the minimum closed pattern region where the touch electrodes 110 are located as the whole coincides with the edges of the display area AA. In this way, in a case where the display area AA is in a shape of a rectangle, a circle or in another irregular shape, part of the touch electrodes 110 at the edge cannot constitute a complete capacitor unit 113.

That is, as shown in FIGS. 1C and 2D, an interval exists between an edge of a minimum closed pattern region where the plurality of capacitor units 113 are located as a whole and the edge of the display area AA. It will be noted that, FIG. 2D illustrates a portion of the minimum closed pattern region where the plurality of capacitor units 113 are located as the whole, and the number of capacitor units 113 is not limited in the embodiments of the present disclosure.

As shown in FIG. 2D, in the case where the human finger or the stylus touches the minimum closed pattern region where the plurality of capacitor units 113 are located as the whole, the touch position can be obtained by the touch display panel 200; and in a case where the human finger or the stylus touches a region inside the display area AA and outside the minimum closed pattern region where the plurality of capacitor units 113 are located as the whole, the touch position cannot be accurately obtained or even obtained by the touch display panel 200.

For example, as shown in FIG. 2D, the minimum closed pattern region where the plurality of capacitor units 113 are located as the whole may be referred to as the touch effective region (as shown by the region AA3 in FIG. 2D), and the region inside the display area AA and outside the touch effective region may be referred to as a touch ineffective region (a dummy region, as shown by the region AA4 in FIG. 2D).

For example, as shown in FIG. 2E, the touch ineffective region is located between the touch effective region and the peripheral area CC. In addition, the touch effective region and the touch ineffective region each are provided with touch electrodes 110 therein, and the touch leads 120 are located in the peripheral area CC. In this way, the width of the peripheral area CC is increased, and thus the frame width of the touch display panel 200 is increased. For example, touch electrodes 110 located in the touch ineffective region may be referred to as dummy blocks.

As can be seen from the description above, in some examples, as shown in FIG. 2B, the display area AA includes the first display region AA1 and the second display region AA2, and the second display region AA2 is disposed around the first display region AA1.

In some embodiments, as shown in FIG. 2B, the minimum enclosed pattern region where the plurality of capacitor units 113 are located as the whole is the first display region AA1.

It will be understood that, in a case where the human finger or the stylus touches the first display region AA1, the touch display panel 200 can obtain the touch position. That is, the first display region AA1 is the touch effective region. For example, as shown in FIG. 2B, an edge of the touch electrodes 110 coincides with an edge of the first display region AA1.

The second display region AA2 is disposed around the first display region AA1, and the touch leads are arranged in the second display region AA2. It will be understood that, since the edge of the touch electrodes 110 coincides with the edge of the first display region AA1, and no touch electrode 110 is provided in the second display region AA2, no touch position can be obtained in the second display region AA2. That is, the second display region AA2 is the touch ineffective region.

That is, in the embodiments of the present disclosure, no touch electrode 110 is provided in the touch ineffective region, and the plurality of touch leads 120 are arranged to extend to the fan-out area BB through the touch ineffective region (i.e., the second display region AA2), so that the narrow frame of the touch display panel 200 can be realized on the basis of not affecting the touch performance of the touch display panel 200. As a result, the reliability of the touch display panel 200 is improved.

In addition, by arranging the edge of the touch electrodes 110 to coincide with the edge of the first display region AA1 (i.e., by arranging the edge of the touch electrodes 110 to coincide with the edge of the touch effective region), it may be possible to avoid the touch electrodes 110 from extending to the touch ineffective region, thereby simplifying the structure of the touch function layer 100, and reducing the cost of the touch function layer 100.

Figure 2F:
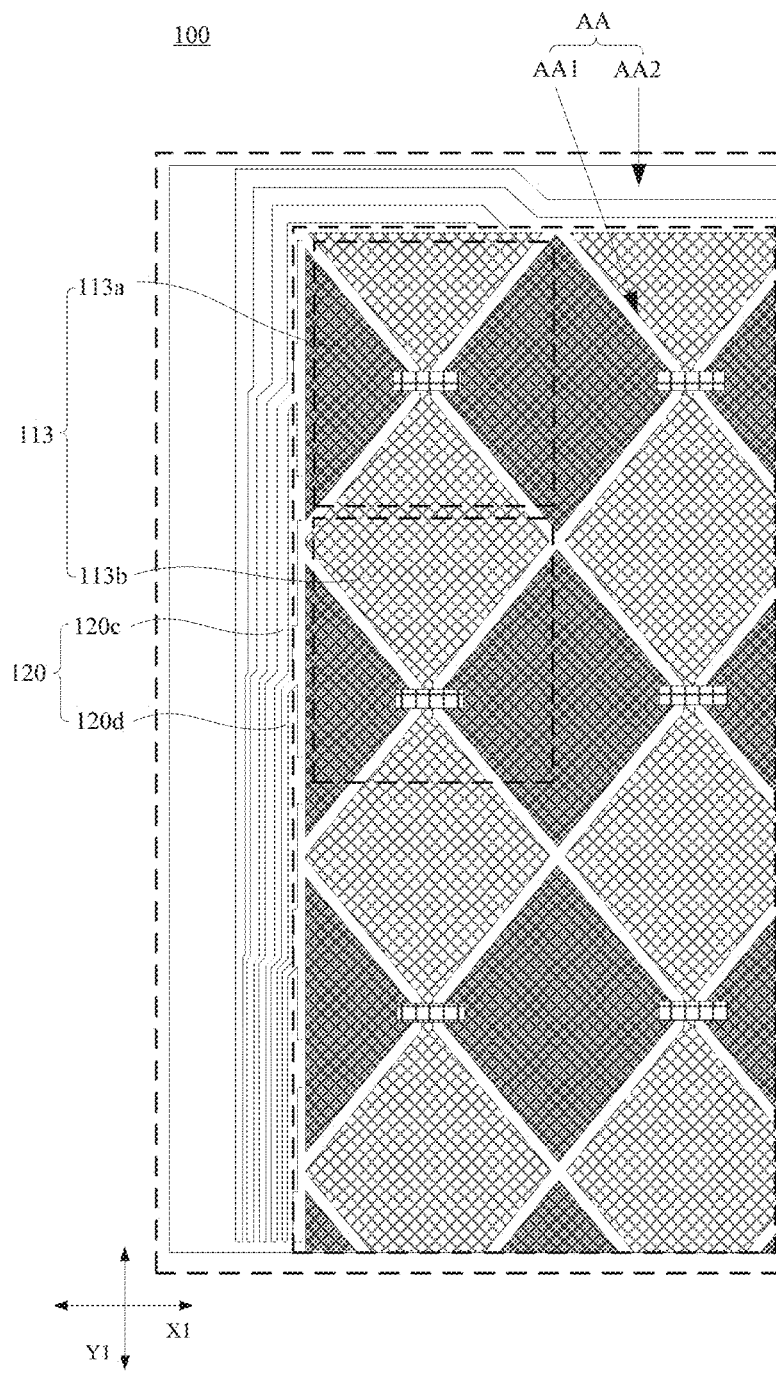
FIG. 2F is a partial structural diagram of a touch function layer, in accordance with some embodiments.

FIG. 2F is a partial structural diagram of the touch function layer, in accordance with some embodiments.

As can be seen from the description above, the plurality of capacitor units 113 can be electrically connected to the plurality of touch leads 120. For example, as shown in FIG. 2F, capacitor units 113 include a capacitor unit 113a and a capacitor unit 113b, and the capacitor unit 113a and the capacitor unit 113b are adjacently disposed along the second direction Y1. It will be noted that, the capacitor unit 113a and the capacitor unit 113b are only used for distinguishing two capacitor units 113 that are adjacently disposed along the second direction Y1, and the capacitor units 113 are not further limited.

As shown in FIG. 2F, touch leads 120 include a touch lead 120c and a touch lead 120d. The touch lead 120c is electrically connected to the capacitor unit 113a, and the touch lead 120d is electrically connected to the capacitor unit 113b. It will be noted that, the touch lead 120c and the touch lead 120d are only used for distinguishing two touch leads 120 that are electrically connected to the capacitor unit 113a and the capacitor unit 113b, respectively, and the touch leads 120 are not further limited.

For example, as shown in FIG. 2F, since the capacitor unit 113a and the capacitor unit 113b are adjacently disposed along the second direction Y1, a length of a portion of the touch lead 120c located in the display area AA is greater than a length of a portion of the touch lead 120d located in the display area AA.

That is, the plurality of capacitor units 113 are arranged in the array, which causes lengths of the plurality of touch leads 120 located in the display area AA to be different, thereby affecting the load uniformity of the plurality of touch leads 120. As a result, the touch performance of the touch function layer 100 is affected.

In some examples, as shown in FIG. 2F, lengths of portions of the plurality of touch leads 120 located in the display area AA gradually increase in a direction away from the display area AA. In some other examples, the lengths of the portions of the plurality of touch leads 120 located in the display area AA gradually decrease in the direction away from the display area AA.

Figure 2G:
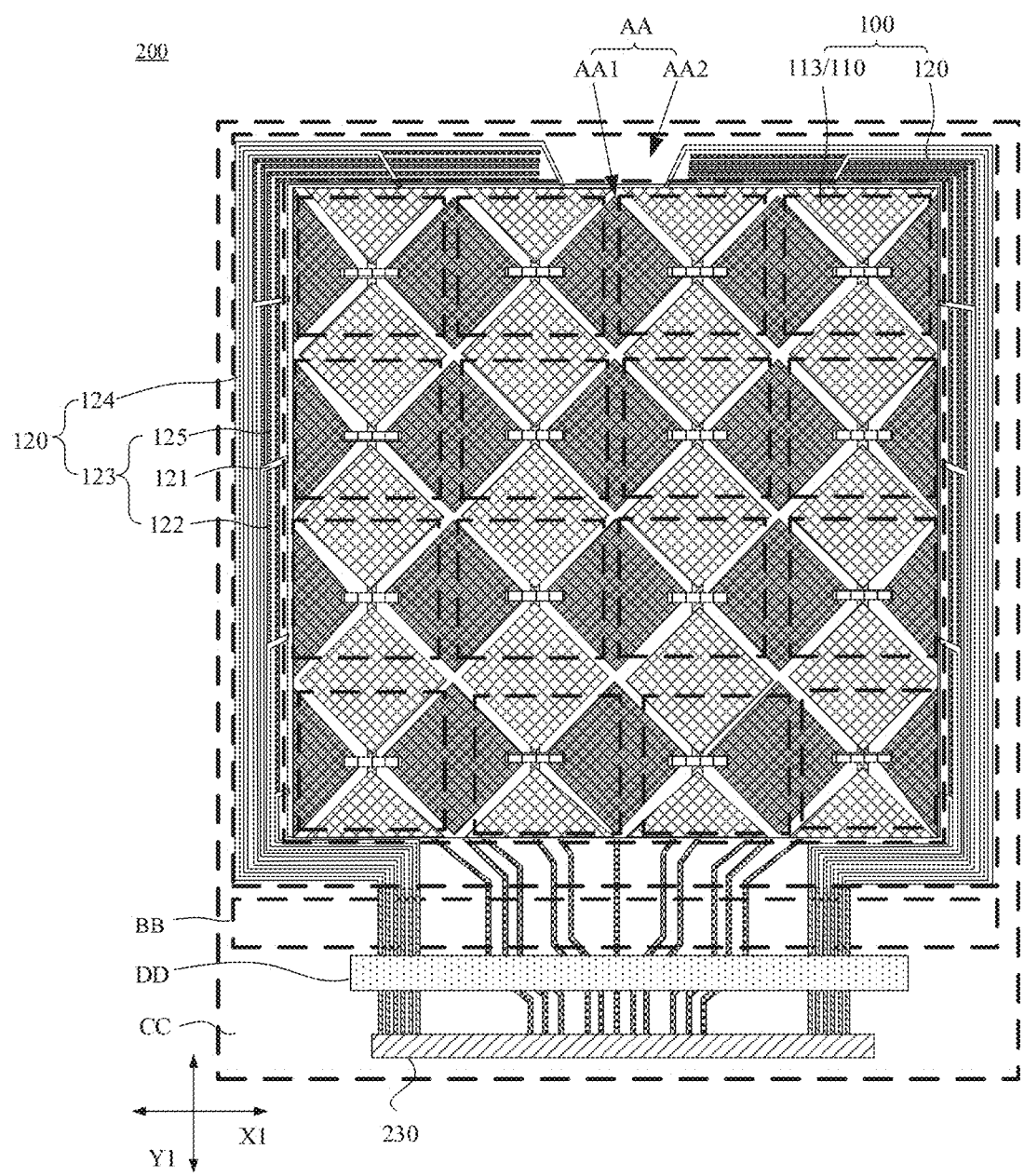
FIG. 2G is yet another structural diagram of a touch display panel, in accordance with some embodiments.
Figure 2H:
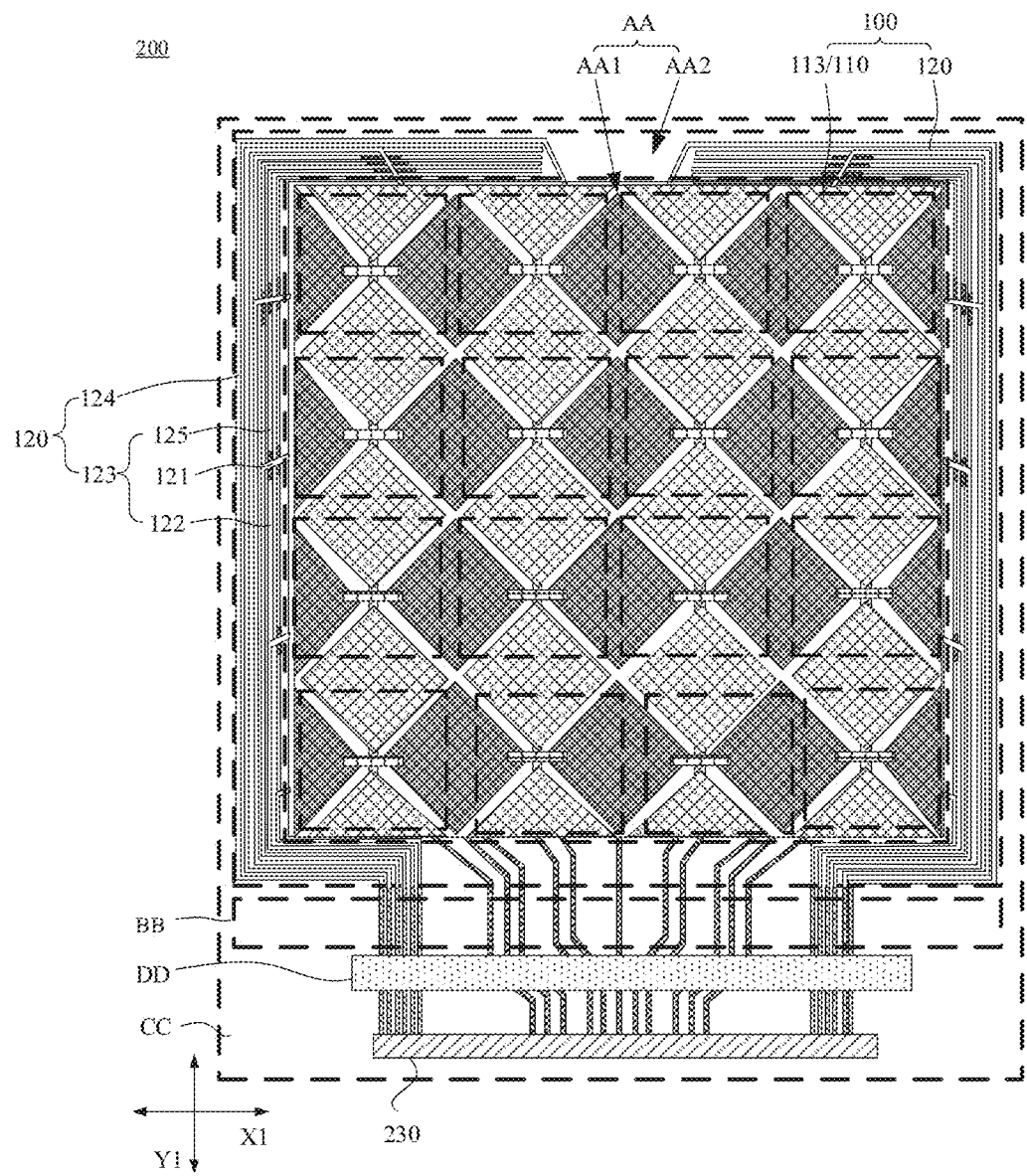
FIG. 2H is yet another structural diagram of a touch display panel, in accordance with some embodiments.

FIG. 2G is yet another structural diagram of the touch display panel, in accordance with some embodiments; FIG. 2H is yet another structural diagram of the touch display panel, in accordance with some embodiments.

Based on this, in some embodiments of the present disclosure, as shown in FIGS. 2G and 2H, an absolute value of a length difference between portions, located in the display area AA, of two touch leads 120 in the plurality of touch leads 120 is in a range of 0 mm to 4 mm, inclusive.

It will be understood that, the length of the portion of the touch lead 120 located in the display area AA is a sum of a length of a portion of the touch lead 120 located in the first display region AA1 and a length of a portion of the touch lead 120 located in the second display region AA2.

In some examples, an absolute value of a length difference between portions of any two touch leads 120 located in the display area AA (including the first display region AA1 and the second display region AA2) is in the range of 0 mm to 4 mm, inclusive.

With such an arrangement, the length uniformity of the portions of the plurality of touch leads 120 located in the display area AA is improved, which improves the resistance uniformity of the plurality of touch leads 120, and can also improve the uniformity of parasitic capacitances formed between the plurality of touch leads 120 and another film layer (e.g., the cathode layer CTD in the display substrate 210 or the touch electrodes 110 located in the first display region AA1), so that the plurality of touch leads 120 can be arranged with equal capacitances. In this way, the load uniformity of the plurality of touch leads 120 can be improved, thereby improving the touch performance of the touch function layer 100. As a result, the use performance of the touch display panel 200 is improved.

In some examples, the absolute value of the length difference between the portions of any two touch leads 120 located in the display area AA may be 0 mm, 1 mm, 2 mm, 3 mm, etc.

As can be seen from the description above, a terminal of the touch lead 120 away from the touch electrode 110 extends to the fan-out area BB. In some examples, lengths of portions of any two touch leads 120 located in fan-out area BB are substantially equal. With such an arrangement, it may be possible to improve the length uniformity of portions of the plurality of touch leads 120 located in the fan-out area BB on the basis of improving the length uniformity of the portions of the plurality of touch leads 120 located in the display area AA. As a result, the length uniformity of the plurality of touch leads 120 (each including the portion located in the display area AA and the portion located in the fan-out area BB) is improved, and thus the touch performance of the touch function layer 100 is further improved.

In some embodiments, as shown in FIGS. 2G and 2H, portions, located in the display area AA, of at least two touch leads 120 in the plurality of touch leads 120 are substantially equal in length.

For example, the absolute value of the length difference between the portions of the at least two touch leads 120 located in the display area AA may range from 0 mm to 3 mm (inclusive), 0 mm to 2 mm (inclusive), or 0 mm to 1 mm (inclusive).

For example, the absolute value of the length difference between the portions of the at least two touch leads 120 located in the display area AA may be 0.5 mm, 1.2 mm, 1.8 mm, or 2.2 mm, or the like.

In some examples, portions of any two touch leads 120 located in the display area AA are substantially equal in length.

With such an arrangement, the length uniformity of the portions of the plurality of touch leads 120 located in the display area AA is improved, which improves the resistance uniformity of the plurality of touch leads 120, and can also improve the uniformity of the parasitic capacitances formed between the plurality of touch leads 120 and another film layer (e.g., the cathode layer CTD in the display substrate 210 or the touch electrodes 110 located in the first display region AA1), so that the plurality of touch leads 120 can be arranged with equal capacitances. In this way, the load uniformity of the plurality of touch leads 120 can be improved, thereby improving the touch performance of the touch function layer 100. As a result, the use performance of the touch display panel 200 is improved.

Figure 3A:
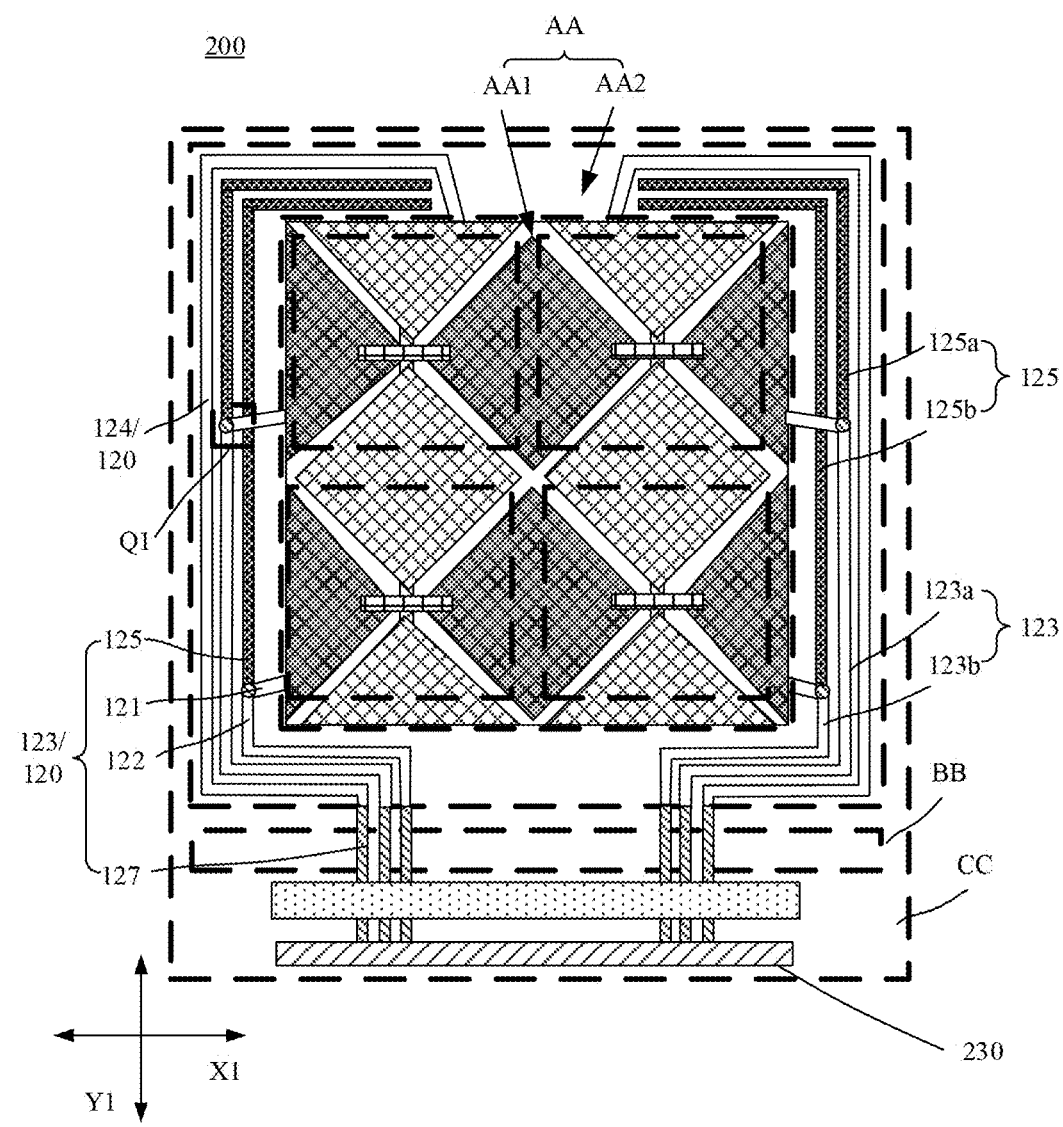
FIG. 3A is yet another structural diagram of a touch display panel, in accordance with some embodiments.

FIG. 3A is yet another structural diagram of the touch display panel, in accordance with some embodiments.

In some embodiments, as shown in FIG. 3A, the touch lead 120 includes a first leading-out line 121 and a second leading-out line 122. A terminal of the first leading-out line 121 is electrically connected to the touch electrode 110 located in the first display region AA1, and another terminal of the first leading-out line 121 extends to the second display region AA2. A terminal of the second leading-out line 122 is electrically connected to a terminal of the first leading-out line 121 away from the touch electrode 110, and another terminal of the second leading-out line 122 extends to a boundary between the second display region AA2 and the fan-out area BB. In addition, the second leading-out line 122 extends along an extending direction of an edge of the first display region AA1.

As can be seen from the description above, in the examples, the edge of the second display region AA2 proximate to the fan-out area BB coincides with the edge of the fan-out area BB proximate to the second display region AA2. In some examples, a terminal of the second leading-out line 122 away from the first leading-out line 121 may extend to an edge position where the second display region AA2 coincides with the fan-out area BB. In some other examples, a gap may also exist between the terminal of the second leading-out line 122 away from the first leading-out line 121 and the edge of the second display region AA2 coinciding with the fan-out area BB.

It will be understood that, the terminal of the first leading-out line 121 is located in the first display region AA1, so that the first leading-out line 121 can be electrically connected to the touch electrode 110 located in the first display region AA1; the another terminal of the first leading-out line 121 extends from the first display region AA1 to the second display region AA2; the terminal of the second leading-out line 122 is electrically connected to the first leading-out line 121, and the another terminal of the second leading-out line 122 extends to the boundary between the second display region AA2 and the fan-out area BB. That is, the first leading-out line 121 and the second leading-out line 122 are both located in the display area AA (including the first display region AA1 and the second display region AA2).

In some examples, as shown in FIG. 3A, lengths of second leading-out lines 122 gradually increase in the direction away from the display area AA. In some other examples, the lengths of the second leading-out lines 122 gradually decrease in the direction away from the display area AA.

In some examples, as shown in FIG. 3A, the touch lead 120 further includes a third leading-out line 127. The third leading-out line 127 is located in the fan-out area BB and electrically connected to the terminal of the second leading-out line 122 away from the first leading-out line 121. In this way, an electrical signal can be transmitted between the fan-out area BB and the first display region AA1 through the first leading-out line 121, the second leading-out line 122 and the third leading-out line 127.

For example, as shown in FIG. 3A, the second leading-out line 122 extends along the extending direction of the edge of the first display region AA1. That is, the extending direction of the second leading-out line 122 is parallel to the extending direction of the edge of the first display region AA1. With such an arrangement, the arrangement regularity of the second leading-out lines 122 can be improved. As a result, it is possible to reduce a space occupied by the second leading-out lines 122, and reduce the risk that the second leading-out lines 122 are observed by naked eyes, thereby improving the display reliability of the touch display panel 200. In addition, it is also possible to shorten a length of the second leading-out line 122, thereby reducing the load of the touch lead 120, and improving the transmission reliability of the signal.

In some examples, a sum of lengths of the first leading-out line 121 and the second leading-out line 122 in any one touch lead 120 is a first set length. As shown in FIG. 3A, in the plurality of touch leads 120, touch leads 120 having the greatest first set length are second touch leads 124, and remaining touch leads 120 are first touch leads 123.

In some examples, multiple second touch leads 124 are provided, and first set lengths of the multiple second touch leads 124 are substantially equal. Multiple first touch leads 123 are provided, and first set lengths of the multiple first touch leads 123 may be equal or unequal. It will be understood that a first set length of any one first touch lead 123 is less than a first set length of the second touch lead 124.

In some examples, as shown in FIG. 3A, the first touch lead 123 further includes a first compensation line 125. The first compensation line 125 is located in the second display region AA2 and electrically connected to a first leading-out line 121 of the first touch lead 123 and/or a second leading-out line 122 of the first touch lead 123.

In some examples, the first compensation line 125 is electrically connected to the first leading-out line 121 of the first touch lead 123. In some other examples, the first compensation line 125 is electrically connected to the second leading-out line 122 of the first touch lead 123. In yet other examples, the first compensation line 125 is electrically connected to terminals, electrically connected to each other, of the first leading-out line 121 and the second leading-out line 122 of the first touch lead 123, so that the first compensation line 125 can be electrically connected to the first leading-out line 121 and the second leading-out line 122 of the first touch lead 123.

It will be understood that, by arranging the first compensation line 125 to be electrically connected to the first leading-out line 121 of the first touch lead 123 and/or the second leading-out line 122 of the first touch lead 123, it is possible to enable the electrical signal on the first leading-out line 121 and the second leading-out line 122 of the first touch lead 123 to be transmitted to the first compensation line 125.

As can be seen from the description above, the first set length of the first touch lead 123 is less than the first set length of the second touch lead 124. Therefore, by arranging the first compensation line 125 to be electrically connected to the first leading-out line 121 of the first touch lead 123 and/or the second leading-out line 122 of the first touch lead 123, it is possible to enable the first compensation line 125 to compensate for the first touch lead 123. As a result, an absolute value of a difference between the first set length of the second touch lead 124 and a sum of the first set length of the first touch lead 123 and a length of the first compensation line 125 is reduced. That is, an absolute value of a length difference between the portions of the plurality of touch leads 120 located in the display area AA can be reduced.

With such an arrangement, the length uniformity of the portions of the plurality of touch leads 120 located in the display area AA is improved, which improves the resistance uniformity of the plurality of touch leads 120, and can also improve the uniformity of the parasitic capacitances formed between the plurality of touch leads 120 and another film layer (e.g., the cathode layer CTD in the display substrate 210 or the touch electrodes 110 located in the first display region AA1), so that the plurality of touch leads 120 can be arranged with equal capacitances. In this way, the load uniformity between the plurality of touch leads 120 can be improved, thereby improving the touch performance of the touch function layer 100. As a result, the use performance of the touch display panel 200 is improved.

In some examples, a sum of lengths of the second leading-out line 122 and the first compensation line 125 of the first touch lead 123 is a second set length, and an absolute value of a difference between second set lengths of two first touch leads 123 is in a range of 0 mm to 4 mm, inclusive.

In some examples, an absolute value of a difference between second set lengths of any two first touch leads 123 is in the range of 0 mm to 4 mm, inclusive.

It will be understood that, the second leading-out line 122 and the first compensation line 125 of the first touch lead 123 are both located in the display area AA (the second display region AA2). Therefore, by setting the absolute value of the difference between the second set lengths of two first touch leads 123 to be in the range of 0 mm to 4 mm, inclusive, it is possible to improve the length uniformity of portions of the first touch leads 123 located in the display area AA (the second display region AA2).

In this way, it is possible to improve the resistance uniformity of the first touch leads 123, and reduce the resistance difference between the first touch leads 123; it is also possible to improve the uniformity of parasitic capacitances formed between the first touch leads 123 and another film layer (e.g., the cathode layer CTD in the display substrate 210 or the touch electrodes 110 located in the first display region AA1), so that the first touch leads 123 can be arranged with equal capacitances. In this way, the load uniformity of the first touch leads 123 can be improved, thereby improving the touch performance of the touch function layer 100. As a result, the use performance of the touch display panel 200 is improved.

For example, the absolute value of the difference between the second set lengths of any two first touch leads 123 may be 0 mm, 1 mm, 2 mm, 3 mm, etc.

As can be seen from the description above, the first leading-out line 121 is included in the touch lead 120 (the touch leads 120 including the first touch leads 123 and the second touch leads 124). In some examples, lengths of first leading-out lines 121 of the plurality of touch leads 120 (including the first touch leads 123 and the second touch leads 124) are substantially equal, which improves the length uniformity of the portions of the plurality of touch leads 120 (including the first touch leads 123 and the second touch leads 124) located in the display area AA, thereby improving the load uniformity of the plurality of touch leads 120 (including the first touch leads 123 and the second touch leads 124). As a result, the touch performance of the touch function layer 100 is improved.

In some examples, the second set length of any one first touch lead 123 (i.e., the sum of the lengths of the second leading-out line 122 and the first compensation line 125 of the first touch lead 123) is substantially equal to the length of the second leading-out line 122 of the second touch lead 124.

With such an arrangement, the length uniformity of the portions of the plurality of touch leads 120 (including the first touch leads 123 and the second touch leads 124) located in the display area AA can be improved, thereby improving the load uniformity of the plurality of touch leads 120 (including the first touch leads 123 and the second touch leads 124). As a result, the touch performance of the touch function layer 100 is improved.

In some embodiments, as shown in FIG. 3A, second set lengths of at least two first touch leads 123 are substantially equal.

For example, an absolute value of a difference between the second set lengths of the at least two first touch leads 123 may range from 0 mm to 3 mm (inclusive), 0 mm to 2 mm (inclusive), or 0 mm to 1 mm (inclusive).

For example, the absolute value of the difference between the second set lengths of the at least two first touch leads 123 may be 0.5 mm, 1.2 mm, 1.8 mm, or 2.2 mm, or the like.

In some examples, second set lengths of any two first touch leads 123 are substantially equal.

With such an arrangement, it may be possible to improve the resistance uniformity of the first touch leads 123, and reduce the resistance difference between the first touch leads 123; and it is also possible to improve the uniformity of parasitic capacitances formed between the first touch leads 123 and another film layer (e.g., the cathode layer CTD in the display substrate 210 or the touch electrodes 110 located in the first display region AA1), so that the first touch leads 123 can be arranged with equal capacitances. In this way, the load uniformity of the first touch leads 123 can be improved, thereby improving the touch performance of the touch function layer 100. As a result, the use performance of the touch display panel 200 is improved.

In some embodiments, as shown in FIG. 3A, the first touch leads 123 include a first first touch lead 123a and a second first touch lead 123b, and a first set length of the first touch lead 123a is greater than a first set length of the second first touch lead 123b. That is, a sum of lengths of a first leading-out line 121 and a second leading-out line 122 of the first touch lead 123a is greater than a sum of lengths of a first leading-out line 121 and a second leading-out line 122 of the second first touch lead 124b.

First compensation lines 125 includes a first first compensation line 125a and a second first compensation line 125b, and a length of the first first compensation line 125a is less than a length of the second first compensation line 125b. As shown in FIG. 3A, the first first compensation line 125a is electrically connected to the first first touch lead 123a, and the second first compensation line 125b is electrically connected to the second first touch lead 123b.

That is, as shown in FIG. 3A, a first compensation line 125 with a smaller length (the first first compensation line 125a) is electrically connected to a first touch lead 123 with a greater first set length (the first first touch lead 123a), and a first compensation line 125 with a greater length (the second first compensation line 125b) is electrically connected to a first touch lead 123 with a smaller first set length (the second first touch lead 123b).

In this way, the first compensation line 125 with the smaller length (the first first compensation line 125a) can compensate for the first touch lead 123 with the greater first set length (the first first touch lead 123a), and the first compensation line 125 with the greater length (the second first compensation line 125b) can compensate for the first touch lead 123 with the smaller first set length (the second first touch lead 123b), which improves the length uniformity of the first touch leads 123, thereby improving the load uniformity of the first touch leads 123. As a result, the touch performance of the touch function layer 100 is improved, and thus the use performance of the touch display panel 200 is improved.

In some embodiments, as shown in FIG. 3A, first set lengths of touch leads 120 gradually increase in the direction away from the display area AA.

As can be seen from the description above, the first set length of the second touch lead 124 is greater than the first set length of any one first touch lead 123. In this way, the first set lengths of the touch leads 120 are set to be gradually increased in the direction away from the display area AA, so that the second touch lead 124 is farther away from the display area AA than any one first touch lead 123.

In addition, as can be seen from the description above, as shown in FIG. 3A, the first compensation line 125 with the smaller length (the first first compensation line 125a) is electrically connected to the first touch lead 123 with the greater first set length (the first first touch lead 123a), and the first compensation line 125 with the greater length (the second first compensation line 125b) is electrically connected to the first touch lead 123 with the smaller first set length (the second first touch lead 123b). In this way, the first set lengths of the touch leads 120 are gradually increased in the direction away from the display area AA, so that lengths of first compensation lines 125 are gradually decreased in the direction away from the display area AA.

In some examples, the first set lengths of the touch leads 120 are gradually increased in an arithmetic progression in the direction away from the display area AA. That is, an absolute value of a difference between first set lengths of any two adjacent touch leads 120 in the direction away from the display area AA is equal. In some other examples, the absolute value of the difference between the first set lengths of any two adjacent touch leads 120 in the direction away from the display area AA may also be unequal.

It will be understood that, the first set lengths of the touch leads 120 are gradually increased in the direction away from the display area AA, which can avoid mutual interference generated when the touch leads 120 extend, and improve the arrangement convenience of the touch leads 120. As a result, the processing convenience of the touch display panel 200 is improved.

In some embodiments, as shown in FIG. 3A, at least part of an orthographic projection of the first compensation line 125 on display substrate 210 is located outside orthographic projections of the first leading-out lines 121 on the display substrate 210 and/or orthographic projections of the second leading-out lines 122 on display substrate 210.

It will be understood that, the at least part of the orthographic projection of the first compensation line 125 on the display substrate 210 is located outside orthographic projections of first leading-out lines 121 of the first touch leads 123 on the display substrate 210 and/or orthographic projections of second leading-out lines 122 of the first touch leads 123 on the display substrate 210; and the at least part of the orthographic projection of the first compensation line 125 on the display substrate 210 is located outside orthographic projections of first leading-out lines 121 of the second touch leads 124 on the display substrate 210 and/or orthographic projections of second leading-out lines 122 of the second touch leads 124 on the display substrate 210.

With such an arrangement, it is possible to reduce parasitic capacitances generated between the first compensation line 125 and the first leading-out lines 121 and parasitic capacitances generated between the first compensation line 125 and the second leading-out lines 122, thereby improving the capacitance uniformity of the first touch leads 123, realizing the arrangement of the first touch leads 123 with equal capacitances, and improving the load uniformity of the first touch leads 123. As a result, the touch performance of the touch function layer 100 is improved, and thus the use performance of the touch display panel 200 is improved.

Figure 3B:
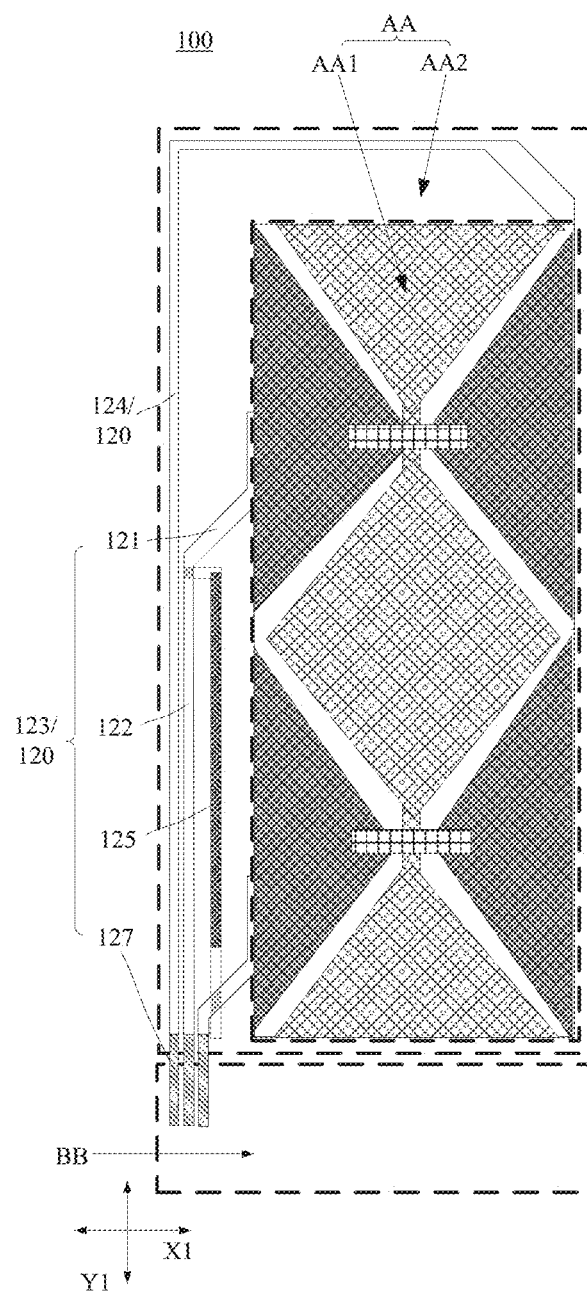
FIG. 3B is another partial structural diagram of a touch function layer, in accordance with some embodiments.
Figure 3C:
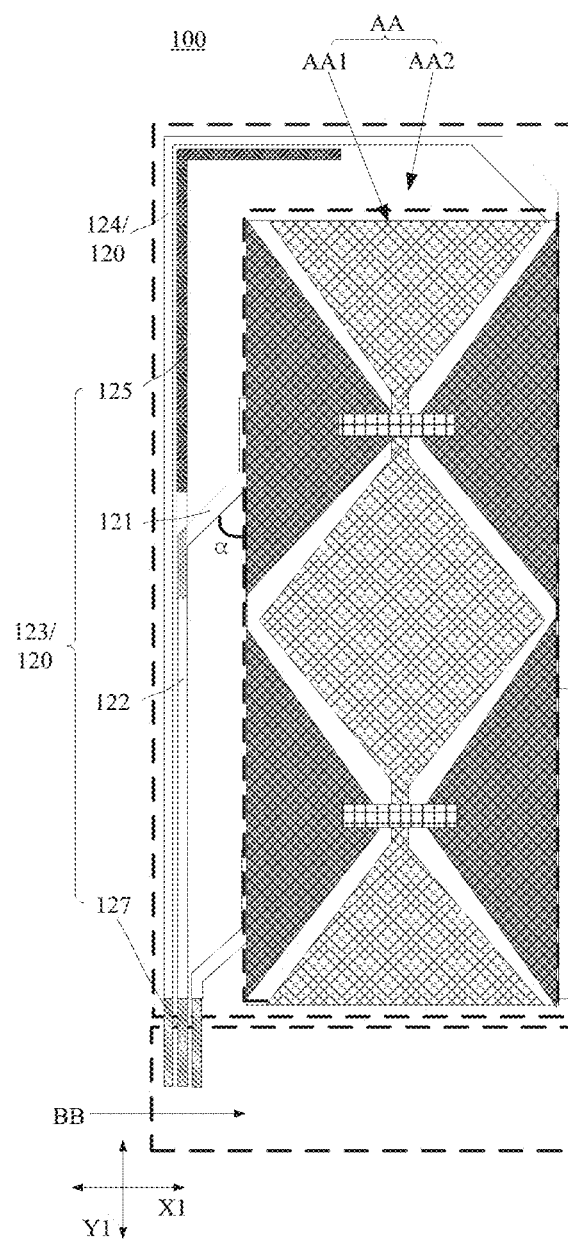
FIG. 3C is yet another partial structural diagram of a touch function layer, in accordance with some embodiments.

FIG. 3B is another partial structural diagram of the touch function layer, in accordance with some embodiments; FIG. 3C is yet another partial structural diagram of the touch function layer, in accordance with some embodiments.

As can be seen from the description above, the first compensation line 125 is electrically connected to the first leading-out line 121 of the first touch lead 123 and/or the second leading-out line 122 of the first touch lead 123. In some examples, as shown in FIG. 3B, a terminal of the first compensation line 125 is electrically connected to the first leading-out line 121 of the first touch lead 123 and/or the second leading-out line 122 of the first touch lead 123, and another terminal of the first compensation line 125 extends along a direction close to the fan-out area BB. In addition, the at least part of the orthographic projection of the first compensation line 125 on display substrate 210 is located outside the orthographic projections of the first leading-out lines 121 on display substrate 210 and/or the orthographic projections of the second leading-out lines 122 on display substrate 210.

In some other examples, as shown in FIG. 3C, a terminal of the first compensation line 125 is electrically connected to the second leading-out line 122 of the first touch lead 123, and another terminal of the first compensation line 125 extends along a direction away from the fan-out area BB. In addition, the at least part of the orthographic projection of the first compensation line 125 on display substrate 210 is located outside the orthographic projections of the first leading-out lines 121 on display substrate 210 and/or the orthographic projections of the second leading-out lines 122 on display substrate 210.

In some examples, as shown in FIG. 3C, a first included angle α exists between the first leading-out line 121 and an end of the touch electrode 110 proximate to the first leading-out line 121, and the first included angle α is an acute angle, which reduces a space occupied by the first leading-out line 121 in the first direction X1, and improves an area utilization rate of the second display region AA2.

Figure 3D:
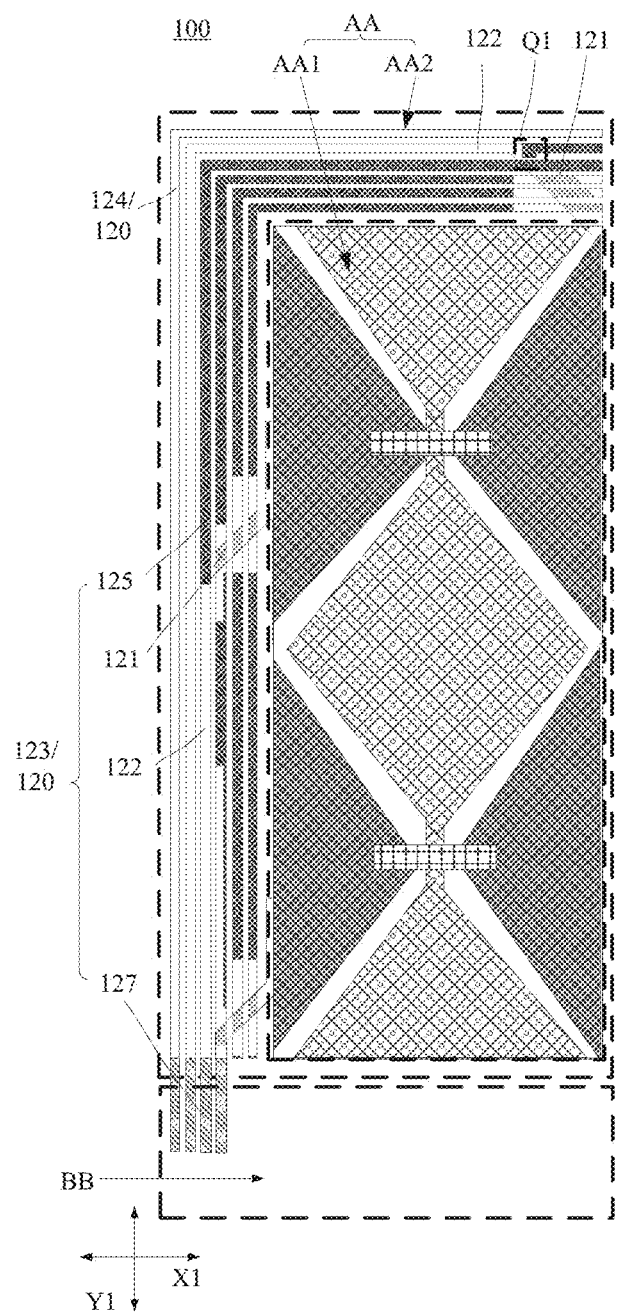
FIG. 3D is yet another partial structural diagram of a touch function layer, in accordance with some embodiments.

FIG. 3D is yet another partial structural diagram of the touch function layer, in accordance with some embodiments.

In some embodiments, as shown in FIG. 3D, the terminal of the second leading-out line 122 electrically connected to the first leading-out line 121 is a first connection terminal Q1.

It will be understood that, for each of the first touch lead 123 and the second touch lead 124, a terminal of a second leading-out line 122 electrically connected to a terminal of a first leading-out line 121 is the first connection terminal Q1.

As shown in FIG. 3D, for the first touch lead 123, a terminal of the first compensation line 125 is electrically connected to the first connection terminal Q1, and another terminal of the first compensation line 125 extends along the extending direction of the edge of the first display region AA1 and along the direction away from the second leading-out line 122.

As can be seen from the description above, as shown in FIG. 3D, the terminal of the second leading-out line 122 away from the first leading-out line 121 extends to the boundary between the second display region AA2 and the fan-out area BB. Therefore, the terminal of the first compensation line 125 is arranged to be connected to the first connection terminal Q1, and the another terminal of the first compensation line 125 is arranged to extend along the direction away from the second leading-out line 122, so that a terminal of the first compensation line 125 away from the first connection terminal Q1 can extend along the direction away from the fan-out area BB.

With such an arrangement, it is possible to reduce an overlapping area between the orthographic projection of the first compensation line 125 on the display substrate 210 and the orthographic projections of the first leading-out lines 121 on the display substrate 210 and an overlapping area between the orthographic projection of the first compensation line 125 on the display substrate 210 and the orthographic projections of the second leading-out lines 122 on the display substrate 210, thereby reducing the parasitic capacitances generated between the first compensation line 125 and the first leading-out lines 121 and the parasitic capacitances generated between the first compensation line 125 and the second leading-out lines 122, improving the capacitance uniformity of the first touch leads 123, realizing the arrangement of the first touch leads 123 with equal capacitances, and improving the load uniformity of first touch leads 123. As a result, the touch performance of the touch function layer 100 is improved, and thus the use performance of the touch display panel 200 is improved.

Moreover, the terminal of the first compensation line 125 away from the first connection terminal Q1 is arranged to extend along the direction away from the second leading-out line 122, so that the first touch leads 123 can be uniformly distributed in the second display region AA2. As a result, it may be possible to reduce the space occupied by the first touch leads 123 in the first direction X1, improve the arrangement regularity of the first touch leads 123, and reduce the risk that the second leading-out lines 122 and the first compensation lines 125 of the first touch leads 123 are observed by naked eyes, thereby improving the display performance of the touch display panel 200.

In addition, as shown in FIG. 3D, the terminal of the first compensation line 125 away from the first connection terminal Q1 is parallel to the extending direction of the edge of the first display region AA1. That is, an extending direction of the first compensation line 125 is parallel to the extending direction of the edge of the first display region AA1.

With such an arrangement, it is possible to improve the arrangement regularity of the first compensation lines 125, reduce a space occupied by the first compensation lines 125, and reduce the risk that the first compensation lines 125 are observed by naked eyes. Moreover, it is also possible to reduce the length of the first compensation line 125, thereby reducing the load of the touch lead 120. As a result, the transmission reliability of the signal is improved.

In some examples, the orthographic projection of the first compensation line 125 on the display substrate 210 may be in a shape of a straight line, a curved line or a polyline (e.g., a wave-shaped line or a saw-tooth line).

In some embodiments, as shown in FIG. 3A, for first compensation lines 125, orthographic projections, on the display substrate 210, of terminals, which are each away from a respective first connection terminal Q1, of the first compensation lines 125 are substantially flush with each other.

As can be seen from the description above, second set lengths of the first touch leads 123 (i.e., each of the second set lengths being the sum of the lengths of the first compensation line 125 and the second leading-out line 122 of the first touch lead 123) are substantially equal. In this way, by arranging the orthographic projections, on the display substrate 210, of the terminals of the first compensation lines 125 that are each away from a respective first connection terminal Q1 to be substantially flush with each other, it is possible to improve the arrangement regularity of the first compensation lines 125 (i.e., the arrangement regularity of the first touch leads 123) on the basis of improving the length uniformity of the portions of the first touch leads 123 located in the display area AA.

In some examples, orthographic projections of the first compensation lines 125 on the display substrate 210 each are in the shape of the straight line or approximate straight line, so that the orthographic projections, on the display substrate 210, of the terminals of the first compensation lines 125 that are each away from a respective first connection terminal Q1 can be substantially flush with each other when the second set lengths of the first touch leads 123 (i.e., each of the second set lengths being the sum of the lengths of the first compensation line 125 and the second leading-out line 122 of the first touch lead 123) are substantially equal.

With such an arrangement, it is possible to save the space occupied by the first touch leads 123; and it may also be possible to improve the arrangement regularity of the first compensation lines 125, so that the risk that the second leading-out lines 122 and the first compensation lines 125 of the first touch leads 123 are observed by naked eyes can be reduced. As a result, and the display performance of the touch display panel 200 is improved.

As can be seen from the description above, in the examples, the sum of the lengths of the second leading-out line 122 and the first compensation line 125 of the first touch lead 123 is the second set length. In some embodiments, as shown in FIG. 3A, a length of the second leading-out line 122 of the second touch lead 124 is substantially equal to the second set length. That is, the length of the second leading-out line 122 of the second touch lead 124 is substantially equal to the sum of the lengths of the second leading-out line 122 and the first compensation line 125 of the first touch lead 123.

For example, an absolute value of a difference between the length of the second leading-out line 122 of the second touch lead 124 and the second set length may range from 0 mm to 3 mm (inclusive), from 0 mm to 2 mm (inclusive), or from 0 mm to 1 mm (inclusive).

For example, the absolute value of the difference between the length of the second leading-out line 122 of the second touch lead 124 and the second set length may be 0.5 mm, 1.2 mm, 1.8 mm, 2.2 mm, or the like.

With such an arrangement, it is possible to improve the uniformity between the length of the portion of the first touch lead 123 located in the display area AA and the length of the portion of the second touch lead 124 located in the display area AA, that is, it is possible to improve the uniformity between the lengths of the portions of the plurality of touch leads 120 (including the first touch leads 123 and the second touch leads 124) located in the display area AA. As a result, the load uniformity of the plurality of touch leads 120 (including the first touch leads 123 and the second touch leads 124) is improved, and thus the touch performance of the touch function layer 100 is improved.

Figure 3E:
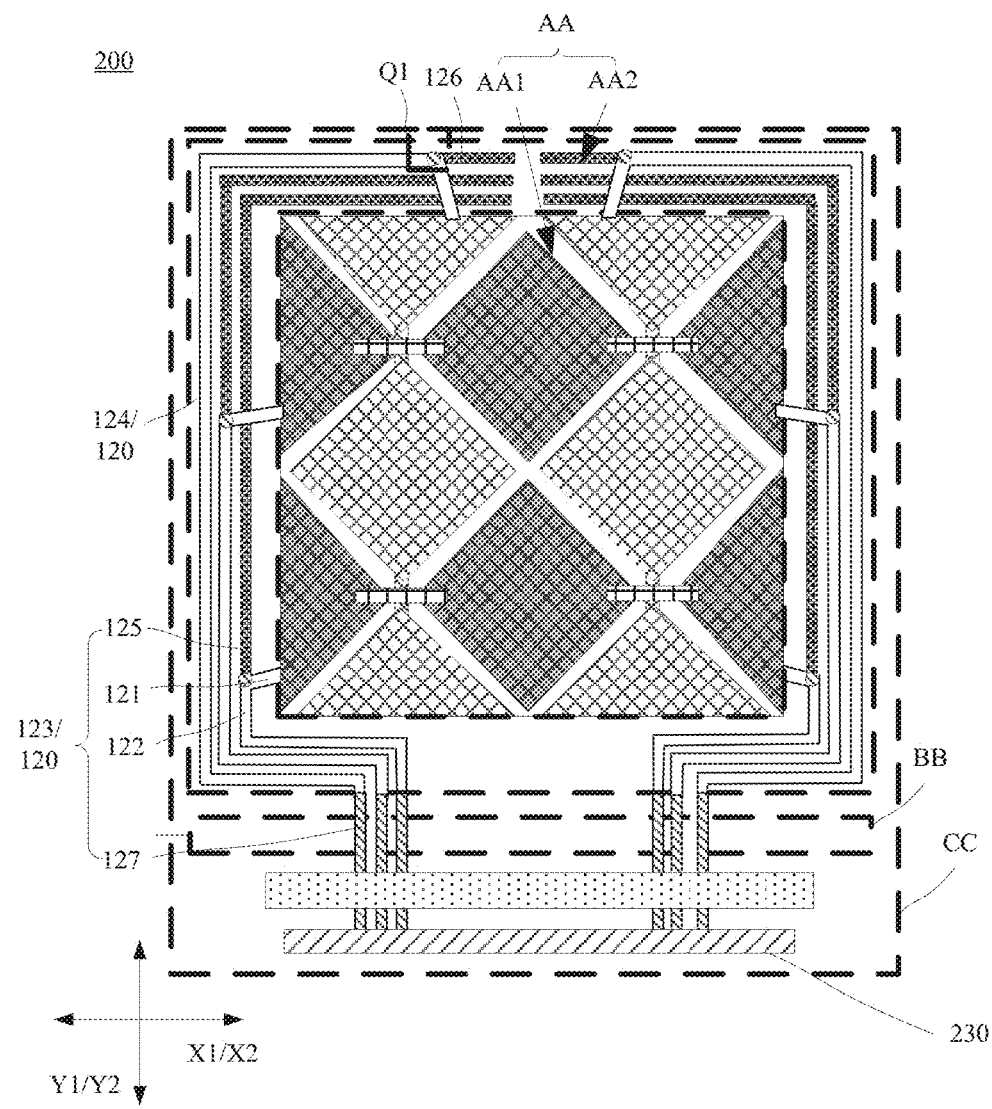
FIG. 3E is yet another structural diagram of a touch display panel, in accordance with some embodiments.

FIG. 3E is yet another partial structural diagram of the touch function layer, in accordance with some embodiments.

As can be seen from the description above, the length of the second leading-out line 122 of the second touch lead 124 is substantially equal to the second set length in the embodiments. In some other embodiments, as shown in FIG. 3E, the second touch lead 124 further includes a second compensation line 126. The second compensation line 126 is located in the second display region AA2 and electrically connected to the first leading-out line 121 of the second touch lead 124 and/or the second leading-out line 122 of the second touch lead 124. A sum of lengths of the second leading-out line 122 and the second compensation line 126 of the second touch lead 124 is substantially equal to the second set length. That is, the sum of the lengths of the second leading-out line 122 and the second compensation line 126 of the second touch lead 124 is substantially equal to the sum of the lengths of the second leading-out line 122 and the first compensation line 125 of the first touch lead 123.

For example, an absolute value of a difference between the second set length and the sum of the lengths of the second-out line 122 and the second compensation line 126 of the second contact lead 124 may range from 0 mm to 3 mm (inclusive), 0 mm to 2 mm (inclusive), or 0 mm to 1 mm (inclusive).

For example, the absolute value of the difference between the second set length and the sum of the lengths of the second-out line 122 and the second compensation line 126 of the second contact lead 124 may be 0.5 mm, 1.2 mm, 1.8 mm, 2.2 mm, or the like.

With such an arrangement, it is possible to improve the uniformity between the length of the portion of the first touch lead 123 located in the display area AA and the length of the portion of the second touch lead 124 located in the display area AA, that is, it is possible to improve the uniformity between the lengths of the portions of the plurality of touch leads 120 (including the first touch leads 123 and the second touch leads 124) located in the display area AA. As a result, the load uniformity of the plurality of touch leads 120 (including the first touch leads 123 and the second touch leads 124) is improved, and thus the touch performance of the touch function layer 100 is improved.

In some examples, the second compensation line 126 is electrically connected to the first leading-out line 121 of the second touch lead 124. In some other examples, the second compensation line 126 is electrically connected to the second leading-out line 122 of the second touch lead 124. In still other examples, the second compensation line 126 is electrically connected to a terminal of the second touch lead 124 where the first leading-out line 121 and the second leading-out line 122 are electrically connected (i.e., the first connection terminal Q1), so that the second compensation line 126 can be electrically connected to the first leading-out line 121 and the second leading-out line 122 of the second touch lead 124.

In some embodiments, as shown in FIG. 3E, at least part of an orthographic projection of the second compensating line 126 on display substrate 210 is located outside the orthographic projections of the first leading-out lines 121 on display substrate 210 and/or the orthographic projections of the second leading-out lines 122 on display substrate 210.

In this way, it is possible to reduce the parasitic capacitances generated between the second compensation line 126 and the first leading-out lines 121 and/or parasitic capacitances generated between the second compensation line 126 and the second leading-out lines 122, improve the capacitance uniformity of the plurality of touch leads 120 (including the first touch leads 123 and the second touch leads 124), realize the arrangement of the plurality of touch leads 120 with equal capacitances, and improve the load uniformity of the plurality of touch leads 120. As a result, the touch performance of the touch function layer 100 is improved, and thus the use performance of the touch display panel 200 is improved.

As can be seen from the description above, the terminal of the second leading-out line 122 electrically connected to the first leading-out line 121 is the first connection terminal Q1. In some examples, as shown in FIG. 3E, for the second touch lead 124, a terminal of the second compensation line 126 is electrically connected to the first connection terminal Q1, and another terminal of the second compensation line 126 extends along the extending direction of the edge of the first display region AA1 and along the direction away from the second leading-out line 122.

With such an arrangement, it is possible to reduce an overlapping area between the orthographic projection of the second compensation line 126 on the display substrate 210 and the orthographic projections of the first leading-out lines 121 on the display substrate 210 and an overlapping area between the orthographic projection of the second compensation line 126 and the orthographic projections of the second leading-out lines 122 on the display substrate 210, thereby reducing the parasitic capacitances generated between the second compensation line 126 and the first leading-out lines 121 and the parasitic capacitances generated between the second compensation line 126 and the second leading-out lines 122, improving the capacitance uniformity of the plurality of touch leads 120 (including the first touch leads 123 and the second touch leads 124), realizing the arrangement of the plurality of touch leads 120 with equal capacitances, and improving the load uniformity of the touch leads 120. As a result, the touch performance of the touch function layer 100 is improved, and thus the use performance of the touch display panel 200 is improved.

Moreover, it is also possible to enable the second touch leads 124 to be uniformly distributed in the second display region AA2, thereby reducing a space occupied by the second touch leads 124 in the first direction X1, improving the arrangement regularity of the second touch leads 124, and reducing the risk that the second leading-out lines 122 and the second compensation lines 126 of the second touch leads 124 are observed by naked eyes. As a result, the display performance of the touch display panel 200 is improved.

In addition, a terminal of the second compensation line 126 away from the first connection terminal Q1 extends along the extending direction of the edge of the first display region AA1. That is, an extending direction of the second compensation line 126 is parallel to the extending direction of the edge of the first display region AA1.

With such an arrangement, it is possible to improve the arrangement regularity of the second compensation lines 126, reduce the space occupied by the second compensation lines 126, reduce the risk that the second compensation lines 126 are observed by naked eyes, and reduces the length of the second compensation line 126. As a result, the load of the touch lead 120 is reduced, and thus the transmission reliability of the signal is improved.

In some examples, as shown in FIG. 3E, an orthographic projection, on the display substrate 210, of the terminal of the second compensation line 126 away from the first connection terminal Q1 is substantially flush with the orthographic projection, on the display substrate 210, of the terminal of the first compensation line 125 away from the first connection terminal Q1.

In some examples, the orthographic projection of the second compensation line 126 on the display substrate 210 is in a shape of a straight line or approximate straight line, so that the orthographic projection, on the display substrate 210, of the terminal of the second compensation line 126 away from the first connection terminal Q1 can be substantially flush with the orthographic projection, on the display substrate 210, of the terminal of the first compensation line 125 away from the first connection terminal Q1.

With such an arrangement, it is possible to save the space occupied by the second touch leads 124; and it is also possible to improve the arrangement regularity of the second compensation lines 126 (i.e., the arrangement regularity of the plurality of touch leads 120), and reduce the risk that the portions of the touch leads 120 (including the first touch leads 123 and the second touch leads 124) located in the display area AA are observed by naked eyes. As a result, the display performance of the touch display panel 200 is improved.

Figure 4A:
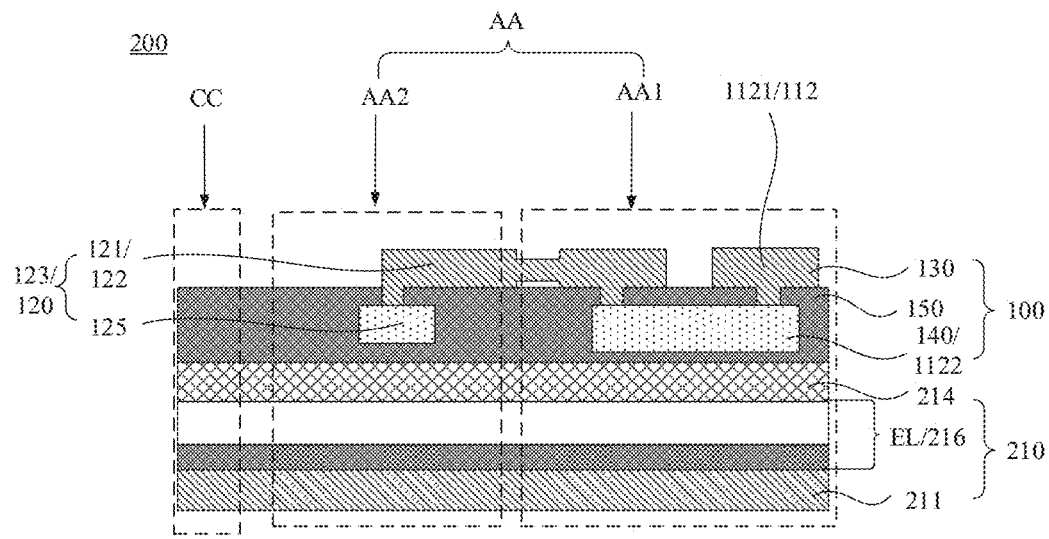
FIG. 4A is yet another structural diagram of a touch display panel, in accordance with some embodiments.

FIG. 4A is yet another structural diagram of the touch display panel, in accordance with some embodiments.

In some embodiments, as shown in FIG. 4A, the touch function layer 100 includes a first conductive layer 130, a second conductive layer 140 and an insulating layer 150. The first conductive layer 130 and the second conductive layer 140 are sequentially arranged. The insulating layer 150 is located between the first conductive layer 130 and the second conductive layer 140.

It will be understood that, the first conductive layer 130 and the second conductive layer 140 are used for arranging the touch leads 120 or the touch electrodes 110 therein; the insulating layer 150 is located between the first conductive layer 130 and the second conductive layer 140, and serves as an electrical isolation.

In some examples, as shown in FIG. 4A, the first conductive layer 130 and the second conductive layer 140 are sequentially arranged on a surface of the encapsulation layer 214 of the display substrate 210 away from the substrate 211. For example, a structure in which the first conductive layer 130 and the second conductive layer 140 are sequentially arranged on the surface of the encapsulation layer 214 away from the substrate 211 is referred to as a structure of flexible multi-layer on cell (FMLOC).

In some other examples, the display substrate 210 further includes a buffer layer 215 (not shown in FIG. 4A, but referring to FIG. 1B), the buffer layer 215 is located on the surface of the encapsulation layer 214 away from the substrate 211, and the first conductive layer 130 and the second conductive layer 140 are sequentially arranged on a side of the buffer layer 215 away from the substrate 211. With such an arrangement, it is possible to protect the encapsulating layer 214, and prevent the encapsulation layer 214 from being damaged in a process of forming the touch function layer 100.

The first conductive layer 130 and the second conductive layer 140 are sequentially arranged. In some examples, as shown in FIG. 4A, the first conductive layer 130 is farther away from the substrate 211 than the second conductive layer 140. In some other examples, the first conductive layer 130 is closer to the substrate 211 than the second conductive layer 140.

As can be seen from the description above, the touch lead 120 includes the first leading-out line 121 and the second leading-out line 122. The first leading-out line 121 further includes the first compensation line 125. In some examples, as shown in FIG. 4A, the first leading-out line 121 and the second leading-out line 122 are located in the first conductive layer 130, and the first compensation line 125 is located in the second conductive layer 140.

It will be understood that, as shown in FIG. 4A, by arranging the first leading-out line 121 and the second leading-out line 122 in the first conductive layer 130, and arranging the first compensation line 125 in the second conductive layer 140, it is possible to avoid the mutual interference between the first leading-out line 121 and the first compensation line 125 and the mutual interference between the second leading-out line 122 and the first compensation line 125 during arrangement of the lines, and improve the arrangement convenience of the first leading-out line 121, the second leading-out line 122 and the first compensation line 125. The process is simple, and there is no need to add an additional mask and repeated etching, which improves the production efficiency of the touch display panel 200, and reduces the production cost of the touch display panel 200.

In addition, the first leading-out line 121 and the second leading-out line 122 are both arranged in the first conductive layer 130, which improves the convenience of electrical connection between the first leading-out line 121 and the second leading-out line 122, thereby improving the production efficiency of the touch display panel 200, and reducing the cost of the touch display panel 200.

As can be seen from the description above, the first compensation line 125 is electrically connected to the first leading-out line 121 of the first touch lead 123 and/or the second leading-out line 122 of the first touch lead 123. In some examples, the insulating layer 150 is provided with fourth via holes (not shown in the figures) therein, and the first compensation line 125 is electrically connected to the first leading-out line 121 of the first touch lead 123 and/or the second leading-out line 122 of the first touch lead 123 through the fourth via hole. The operation is simple, and the implementation is easy. As a result, the production efficiency of the touch display panel 200 is improved, and the production cost of the touch display panel 200 is reduced.

As can be seen from the description above, in the examples, the second touch lead 124 includes the second compensation line 126. For example, the second compensation line 126 is located in the second conductive layer 140. That is, the second compensation line 126 is located in a conductive layer that is different from the first leading-out line 121 and the second leading-out line 122. As a result, it may be possible to avoid the mutual interference between the second compensation line 126 and the first leading-out line 121 and the mutual interference between the second compensation line 126 and the second leading-out line 122 during the arrangement of the lines, and improve the arrangement convenience of the first leading-out line 121, the second leading-out line 122 and the second compensation line 126, thereby improving the processing convenience of the touch display panel 200.

Figure 4B:
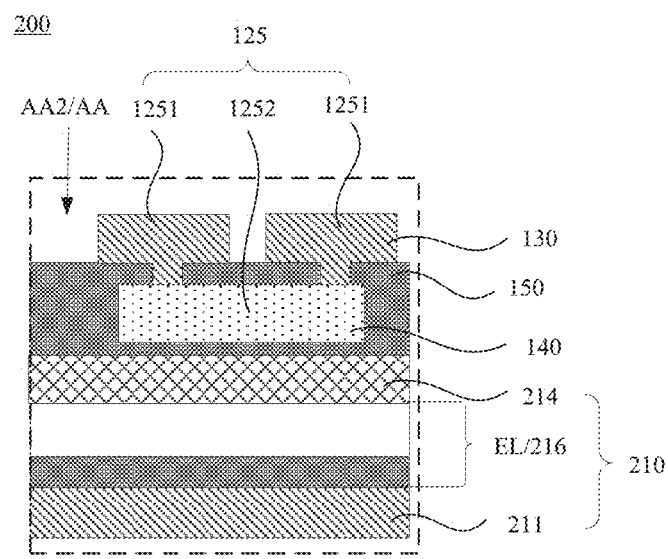
FIG. 4B is yet another structural diagram of a touch display panel, in accordance with some embodiments.

FIG. 4B is yet another structural diagram of the touch display panel, in accordance with some embodiments.

As can be seen from the description above, in the embodiments, as shown in FIG. 4A, the first leading-out line 121 and the second leading-out line 122 are located in the first conductive layer 130, and the first compensation line 125 is located in the second conductive layer 140. In some other embodiments, as shown in FIG. 4B, the first leading-out line 121 and the second leading-out line 122 are located in the first conductive layer 130; the first compensation line 125 includes at least two first compensation sub-lines 1251 that are arranged at intervals and at least one first connection portion 1252. The first compensation sub-lines 1251 are located in the first conductive layer 130, and the at least one first connection portion 1252 is located in the second conductive layer 140.

It will be understood that, lengths of the at least two first compensation sub-lines 1251 may be the same or different, and intervals between at least two first compensation sub-lines 1251 may be the same or different. It will be understood that, in a case where a plurality of first connection portions 1252 are provided, the plurality of first connection portions 1252 are all located in the second conductive layer 140.

It will be understood that, as shown in FIG. 4B, the first connection portion 1252 can be electrically connected to two adjacent first compensation sub-lines 1251 through first via holes in the insulating layer 150, so that the electrical signal can be transmitted on the first compensation sub-lines 1251 through the first connection portion 1252.

Figure 4C:
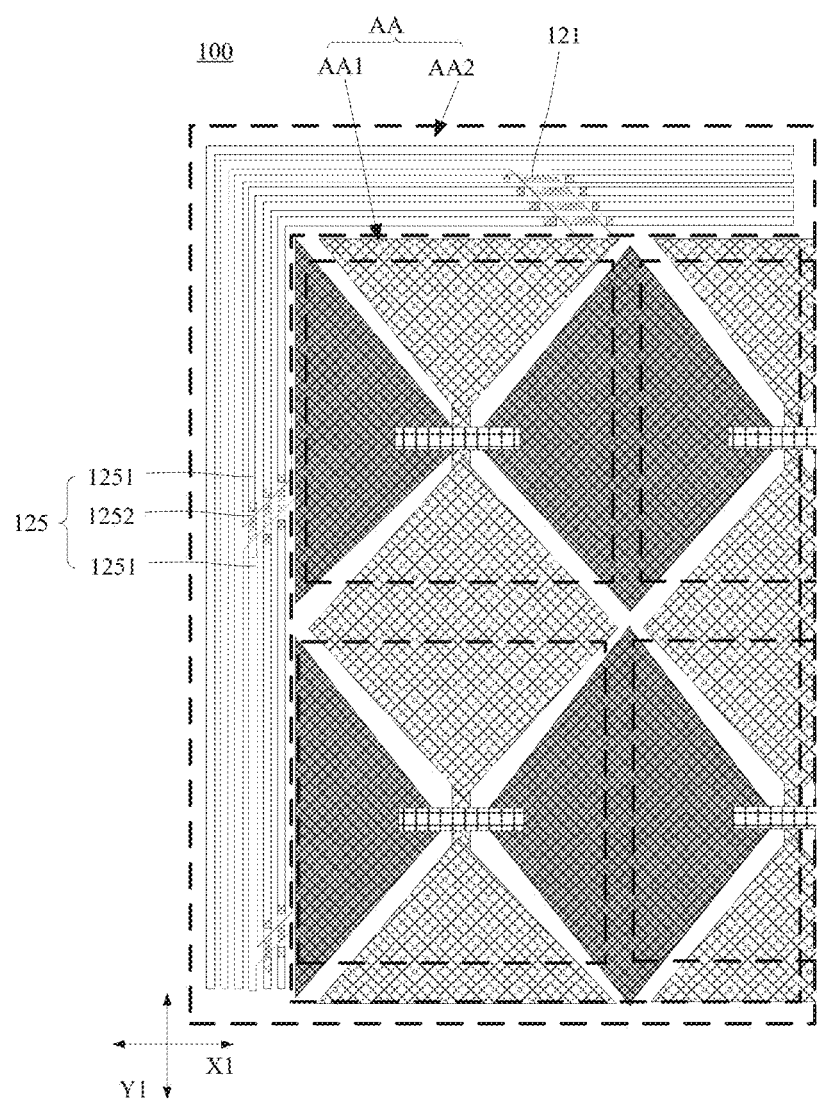
FIG. 4C is yet another partial structural diagram of a touch function layer, in accordance with some embodiments.

FIG. 4C is yet another partial structural diagram of the touch function layer, in accordance with some embodiments.

In some examples, as shown in FIG. 4C, the first connection portion 1252 crosses the first leading-out line 121. That is, an orthographic projection of first connection portion 1252 on display substrate 210 intersects the orthographic projection of the first leading-out line 121 on display substrate 210.

For example, as shown in FIG. 4C, in a case where the touch function layer 100 includes multiple first compensation lines 125, first connection portions 1252 in different first compensation lines 125 may cross the same first leading-out line 121.

It will be understood that, the first connection portion 1252 is arranged to be located in the second conductive layer 140, the first leading-out line 121, the second leading-out line 122 and the first compensation sub-lines 1251 are arranged to be located in the first conductive layer 130, and the first connection portion 1252 can cross the first leading-out line 121 to be electrically connected to two adjacent first compensation sub-lines 1251, which avoids the mutual interference between the first compensation line 125 (including the first compensation sub-lines 1251 and the first connection portion(s) 1252) and the first leading-out line 121 and the mutual interference between the first compensation line 125 and the second leading-out line 122 during the arrangement of the lines, thereby improving the arrangement flexibility of the first leading-out line 121, the second leading-out line 122 and the first compensation line 125, and meeting different use requirements. Moreover, the process is simple, and there is no need to add an additional mask and repeated etching, which improves the production efficiency of the touch display panel 200, and reduces the production cost of the touch display panel 200.

As can be seen from the description above, as shown in FIG. 3E, in the examples, the second compensation line 126 is included in the second touch lead 124. In some examples, the second compensation line 126 includes a plurality of second compensation sub-lines that are arranged at intervals and second connection portion(s). The second compensation sub-lines are located in the first conductive layer 130, and the second connection portion is located in the second conductive layer and crosses the first leading-out line 121. The second connection portion is electrically connected to two adjacent second compensation sub-lines through third via holes (not shown in the figures) in the insulating layer 150.

With such an arrangement, it may be possible to avoid the mutual interference between the second compensation line 126 (including the second compensation sub-lines and the second connection portion(s)) and the first leading-out line 121 and the mutual interference between the second compensation line 126 and the second leading-out line 122 during the arrangement of the lines, thereby improving the arrangement flexibility of the first leading-out line 121, the second leading-out line 122 and the second compensation line 126, and meeting different use requirements.

In some examples, as shown in FIGS. 4A and 4B, the first conductive layer 130 is farther away from the substrate 211 than the second conductive layer 140. In this way, by arranging the first compensation line 125 (or the first compensation sub-lines 1251 of the first compensation line 125), the first leading-out line 121, and the second leading-out line 122 to be located in the first conductive layer 130, it is possible to increase a distance between the conductive film layer 216 (e.g., the cathode layer CTD) of the display substrate 210 and each of the first compensation lines 125 (or the first compensation sub-lines 1251 of the first compensation line 125), the first leading-out line 121 and the second leading-out line 122, and reduce a parasitic capacitance formed between the conductive film layer 216 of the display substrate 210 and each of the first compensation lines 125 (or the first compensation sub-lines 1251 of the first compensation line 125), the first leading-out line 121 and the second leading-out line 122, thereby reducing the load of the touch lead 120. As a result, the touch performance of the touch function layer 100 is improved, and thus the performance of the touch display panel 200 is improved.

As can be seen from the description above, as shown in FIG. 1B, the plurality of touch electrodes 110 include the plurality of first touch electrodes 111 and the plurality of second touch electrodes 112. The plurality of first touch electrodes 111 are arranged at intervals along the first direction X1, and all extend along the second direction Y1 intersecting the first direction X1. The plurality of second touch electrodes 112 are arranged at intervals along the second direction Y1, and all extend along the first direction X1. The plurality of second touch electrodes 112 and the plurality of first touch electrodes 111 cross each other and are insulated from each other, so as to constitute a capacitor unit 113 at each crossing position. The minimum closed pattern region where the plurality of capacitor units 113 are located as the whole is the first display region AA1.

For example, the second touch electrode 112 includes the plurality of touch sub-electrodes 1121 that are arranged at intervals and the plurality of bridging portions 1122.

In some embodiments, as shown in FIG. 1B, the plurality of first touch electrodes 111 are located in the first conductive layer 130. The plurality of touch sub-electrodes 1121 are located in the first conductive layer 130. The plurality of bridging portions 1122 are located in the second conductive layer 140. The bridging portion 1122 crosses the first touch electrode 111 and is electrically connected to two adjacent touch sub-electrodes 1121 through second via holes in the insulating layer 150.

It will be understood that, the bridging portion 1122 crosses the first touch electrode 111, which means that, the orthographic projection of the bridging portion 1122 on the display substrate 210 intersects the orthographic projection of the first touch electrode 111 on the display substrate 210. For example, as shown in FIG. 1E, the orthographic projection of the bridging portion 1122 on the display substrate 210 intersects the orthographic projection of the connecting structure 1112 of the first touch electrode 111 on the display substrate 210.

With such an arrangement, the electrical signal can be transmitted on the touch sub-electrodes 1121 through the bridging portion 1122. In addition, the bridging portion 1122 is located in the second conductive layer 140, and the first touch electrode 111 (including the touch structures 1111 and the connecting structures 1112) and the touch sub-electrodes 1121 of the second touch electrode 112 are both located in the first conductive layer 130, which avoids mutual interference between the connecting structure 1112 of the first touch electrode 111 and the bridging portion 1122 of the second touch electrode 112 when the first touch electrode 111 and the second touch electrode 112 extend, thereby improving the reliability of the touch function layer 100.

In some examples, as shown in FIG. 1B, the first conductive layer 130 is farther away from the substrate 211 than the second conductive layer 140. In this way, by arranging the first touch electrode 111 (including the touch structures 1111 and the connecting structures 1112) and the touch sub-electrodes 1121 of the second touch electrode 112 to be located in the first conductive layer 130, it may be possible to increase a distance between the conductive film layer 216 (e.g., the cathode layer CTD) of the display substrate 210 and each of the first touch electrode 111 and the touch sub-electrodes 1121 of the second touch electrode 112, and reduce a parasitic capacitance formed between the conductive film layer 216 (e.g., the cathode layer CTD) of the display substrate 210 and each of the first touch electrode 111 and the touch sub-electrodes 1121 of the second touch electrode 112. As a result, the touch performance of the touch function layer 100 is improved, and thus the performance of the touch display panel 200 is improved.

As can be seen from the description above, as shown in FIGS. 1A and 1B, the display substrate 210 includes the substrate 211. The plurality of sub-pixels 220 are located on the side of the substrate 211 and in the display area AA.

Figure 5A:
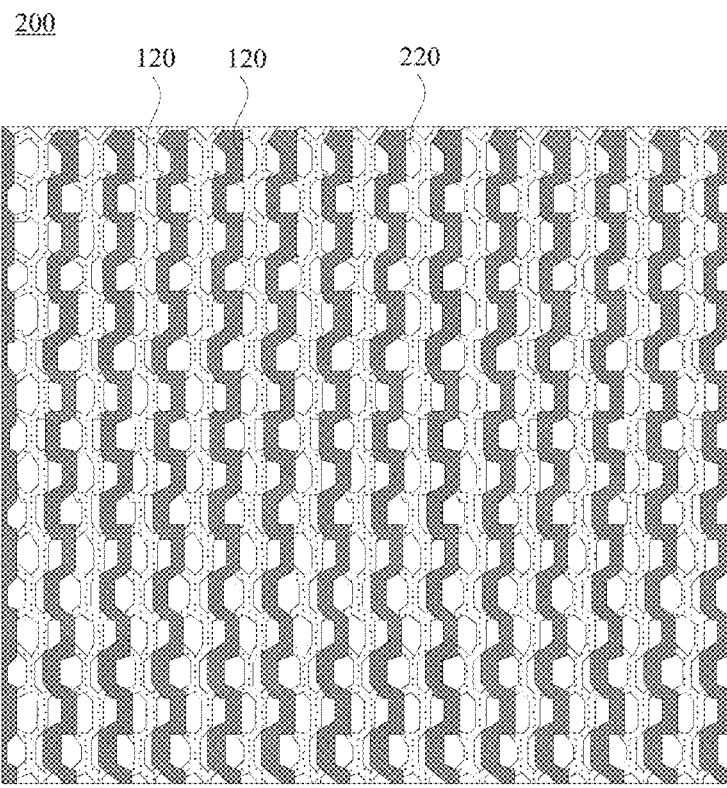
FIG. 5A is a diagram showing a positional relationship between touch leads and sub-pixels, in accordance with some embodiments.
Figure 5B:
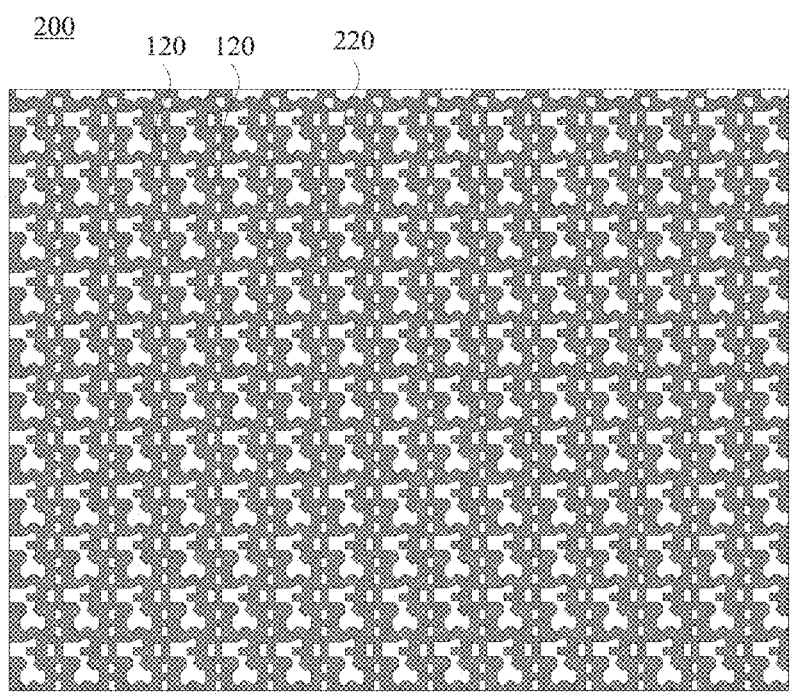
FIG. 5B is another diagram showing a positional relationship between touch leads and sub-pixels, in accordance with some embodiments.

FIG. 5A is a diagram showing a projected positional relationship between the touch leads and the sub-pixels, in accordance with some embodiments; FIG. 5B is another diagram showing a projected positional relationship between the touch leads and the sub-pixels, in accordance with some embodiments.

In some embodiments, as shown in FIGS. 5A and 5B, an orthographic projection of at least one touch lead 120 on the substrate 211 avoids an orthographic projection of a light-emitting region of the sub-pixel 220 on the substrate 211.

It will be understood that the sub-pixel 220 emits light outward through the light-emitting region. The orthographic projection of the at least one touch lead 120 on the substrate 211 avoids the orthographic projection of the light-emitting region of the sub-pixel 220 on the substrate 211, which means that, the orthographic projection of the at least one touch lead 120 on the substrate 211 is not overlapped with the orthographic projection of the light-emitting region of the sub-pixel 220 on the substrate 211, thereby reducing the shielding caused by the touch lead 120 arranged in the second display region AA2 to the light-emitting region of the sub-pixel 220 in the second display region AA2. As a result, the influence of the touch lead 120 on the image information displayed in the second display region AA2 is reduced, which improves the display reliability of the touch display panel 200.

In some examples, as shown in FIG. 5A, the orthographic projection of the at least one touch lead 120 on the substrate 211 is in a shape of a curve, such as a wave or approximate wave, so that the orthographic projection of the at least one touch lead 120 on the substrate 211 can avoid the orthographic projection of the light-emitting region of the sub-pixel 220 on the substrate 211.

In some other examples, as shown in FIG. 5B, at least one touch lead 120 is provided with through holes therein, and a position of the through hole corresponds to a position of the light-emitting region of the sub-pixel 220, so that the orthographic projection of the at least one touch lead 120 on the substrate 211 can avoid the orthographic projection of the light-emitting region of the sub-pixel 220 on the substrate 211.

In some embodiments, as shown in FIG. 3E, a direction in which the display area AA and the fan-out area BB are arranged is a third direction Y2. A direction perpendicular to a thickness direction of the display substrate 210 and intersecting the third direction Y2 is a fourth direction X2. In some examples, the third direction Y2 is the vertical direction and the fourth direction X2 is the horizontal direction; the third direction Y2 is perpendicular to the fourth direction X2. For example, the third direction Y2 is parallel to the second direction Y1, and the fourth direction X2 is parallel to the first direction X1.

As shown in FIG. 3E, at least part of the plurality of touch leads 120 are distributed on two sides of the first display region AA1 in the fourth direction X2, respectively. That is, the at least part of the plurality of touch leads 120 can extend to the fan-out area BB along portions of the second display regions AA2 located at two sides in the fourth direction X2, respectively, so that widths of frames of the touch display panel 200 at two sides in the fourth direction X2 can be reduced, and the uniformity of the widths of the frames of the touch display panel 200 at two sides in the fourth direction X2 can be improved. As a result, the visual effect of the touch display panel 200 is improved.

Figure 6:
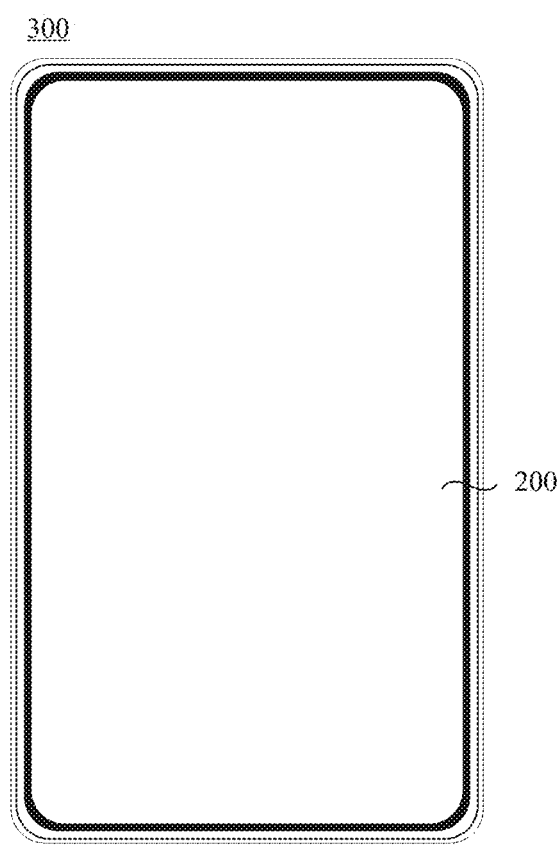
FIG. 6 is a structural diagram of a touch display apparatus, in accordance with some embodiments.

FIG. 6 is a structural diagram of a touch display apparatus, in accordance with some embodiments.

In another aspect, as shown in FIG. 6, some embodiments of the present disclosure provide the touch display apparatus 300. The touch display apparatus 300 includes the touch display panel 200 described above. Therefore, the touch display apparatus 300 has same beneficial effects as described above, and details will not be repeated here.

For example, the touch display apparatus 300 further includes the flexible printed circuit board, the driver IC and the touch IC. As can be seen from the description above, the flexible printed circuit board is bonded to connecting pins in the connecting area 230; the driver IC is mounted on the flexible printed circuit board by using the COF process; the touch IC is mounted on the flexible printed circuit board by using the COF process. Alternatively, the touch IC may be mounted, by using the COP process, on the substrate 211 of the touch display substrate 210 located in the bonding area 240; and the touch IC is electrically connected to connecting pins in the connecting area 230.

It will be understood that, the touch display apparatus 300 is a product having an image display function. For example, the touch display apparatus 300 may be used to display a still image, such as the picture or photograph. The touch display apparatus 300 may also be used to display a dynamic image, such as a videos or game image.

In some examples, the display apparatus 300 may be a laptop computer, a mobile phone, a wireless apparatus, a personal data assistant (PDA), a hand-held or portable computer, a global positioning system (GPS) receiver/navigator, a camera, an MPEG-4 Part 14 (MP4) video player, a video camera, a game console, a watch, a clock, a calculator, a television monitor, a flat panel display, a computer monitor, an automobile display (e.g., an odometer display), a navigator, a cockpit controller and/or display, a camera view display (e.g., a display of a rear-view camera in a vehicle), an electronic photo, an electronic billboard or signage, a projector, a packaging and aesthetic structure (e.g., a display for displaying an image of a piece of jewelry), etc.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A touch display panel, having a display area and a fan-out area located at a side of the display area, wherein the display area includes a first display region and a second display region located around the first display region;
   the touch display panel comprises:
   a display substrate having a display side; and
   a touch function layer located on the display side of the display substrate, wherein the touch function layer includes a plurality of touch electrodes and a plurality of touch leads; the plurality of touch electrodes are located in the first display region, and the plurality of touch leads are electrically connected to the plurality of touch electrodes and extend to the fan-out area through the second display region; and one portion of each touch lead is located in the second display region, another portion of each touch lead is located in the fan-out area; wherein
   the plurality of touch leads each include:
   a first leading-out line, wherein a terminal of the first leading-out line is electrically connected to a touch electrode in the plurality of touch electrodes and located in the first display region, and another terminal of the first leading-out line extends to the second display region; and
   a second leading-out line, wherein a terminal of the second leading-out line is electrically connected to a terminal of the first leading-out line away from the touch electrode, and another terminal of the second leading-out line extends to a boundary between the second display region and the fan-out area; the second leading-out line extends along an extending direction of an edge of the first display region;
   wherein a sum of lengths of the first leading-out line and the second leading-out line in any one touch lead is a first set length; in the plurality of touch leads, touch leads having a greatest first set length are second touch leads, and remaining touch leads are first touch leads;
   a first touch lead in the first touch leads further includes:
   a first compensation line located in the second display region and electrically connected to a first leading-out line of the first touch lead and/or a second leading-out line of the first touch lead.

2. The touch display panel according to claim 1, wherein in two touch leads of the plurality of touch leads, an absolute value of a difference between a length of portion, located in the display area, of one touch lead of the two touch leads and a length of portion, located in the display area, of another touch lead of the two touch leads is in a range of 0 mm to 4 mm, inclusive.

3. The touch display panel according to claim 2, wherein portions, located in the display area, of at least two touch leads in the plurality of touch leads are substantially equal in length.

4. The touch display panel according to claim 1, wherein for the first touch lead, a sum of lengths of the second leading-out line and the first compensation line is a second set length; an absolute value of a difference between second set lengths of two first touch leads in the first touch leads is in a range of 0 mm to 4 mm, inclusive; or
   for the first touch lead, the sum of lengths of the second leading-out line and the first compensation line is the second set length; second set lengths of at least two first touch leads in the first touch leads are substantially equal.

5. The touch display panel according to claim 1, wherein the first touch leads include a first first touch lead and a second first touch lead, and a first set length of the first first touch lead is greater than a first set length of the second first touch lead;
   first compensation lines of the first touch leads include a first first compensation line and a second first compensation line, and a length of the first first compensation line is less than a length of the second first compensation line; and
   the first first compensation line is electrically connected to the first first touch lead, and the second first compensation line is electrically connected to the second first touch lead.

6. The touch display panel according to claim 1, wherein first set lengths of touch leads in the plurality of touch leads increase in a direction away from the display area.

7. The touch display panel according to claim 1, wherein at least part of an orthographic projection of the first compensation line on the display substrate is located outside orthographic projections of first leading-out lines of the plurality of touch leads on the display substrate and/or orthographic projections of second leading-out lines of the plurality of touch leads on the display substrate.

8. The touch display panel according to claim 1, wherein for the first touch lead, a terminal of the second leading-out line electrically connected to the first leading-out line is a first connection terminal; for the first touch lead, a terminal of the first compensation line is electrically connected to the first connection terminal, and another terminal of the first compensation line extends along the extending direction of the edge of the first display region and along a direction away from the second leading-out line.

9. The touch display panel according to claim 8, wherein for first compensation lines of the first touch leads, orthographic projections, on the display substrate, of terminals, which are each away from a respective first connection terminal, of the first compensation lines are substantially flush with each other.

10. The touch display panel according to claim 1, wherein the touch function layer includes:
a first conductive layer and a second conductive layer that are sequentially arranged; and
an insulating layer located between the first conductive layer and the second conductive layer;
wherein the first leading-out line and the second leading-out line are located in the first conductive layer, and the first compensation line is located in the second conductive layer.

11. The touch display panel according to claim 1, wherein the touch function layer includes:
a first conductive layer and a second conductive layer that are sequentially arranged; and
an insulating layer located between the first conductive layer and the second conductive layer;
wherein the first leading-out line and the second leading-out line are located in the first conductive layer;
the first compensation line includes:
at least two first compensation sub-lines that are arranged at intervals and located in the first conductive layer; and
at least one first connection portion located in the second conductive layer; a first connection portion in the at least one first connection portion crosses the first leading-out line and is electrically connected to two adjacent first compensation sub-lines in the at least two first compensation sub-lines through first via holes in the insulating layer.

12. The touch display panel according to claim 10, wherein the plurality of touch electrodes include:
a plurality of first touch electrodes that are arranged at intervals along a first direction and all extend along a second direction intersecting the first direction, the plurality of first touch electrodes being located in the first conductive layer; and
a plurality of second touch electrodes that are arranged at intervals along the second direction and all extend along the first direction;
wherein the plurality of second touch electrodes and the plurality of first touch electrodes cross each other and are insulated from each other, so as to constitute a capacitor unit at each crossing position; and a minimum closed pattern region where all capacitor units are located as a whole is the first display region;
a second touch electrode in the plurality of second touch electrodes includes:
a plurality of touch sub-electrodes that are arranged at intervals and are located in the first conductive layer; and
a plurality of bridging portions located in the second conductive layer, wherein a bridging portion in the plurality of bridging portions crosses a first touch electrode in the plurality of first touch electrodes and is electrically connected to two adjacent touch sub-electrodes in the plurality of touch sub-electrodes through second via holes in the insulating layer.

13. The touch display panel according to claim 4, wherein a length of a second leading-out line of a second touch lead in the second touch leads is substantially equal to the second set length; or
the second touch lead further includes:
a second compensation line located in the second display region and electrically connected to a first leading-out line of the second touch lead and/or a second leading-out line of the second touch lead, wherein for the second touch lead, a sum of lengths of the second leading-out line and the second compensation line is substantially equal to the second set length.

14. The touch display panel according to claim 1, wherein the display substrate includes:
a substrate; and
a plurality of sub-pixels located on a side of the substrate and located in the display area;
an orthographic projection of at least one touch lead in the plurality of touch leads on the substrate avoids an orthographic projection of a light-emitting region of a sub-pixel in the plurality of sub-pixels on the substrate.

15. The touch display panel according to claim 1, wherein the display area and the fan-out area are arranged in a third direction, and a direction perpendicular to a thickness direction of the display substrate and intersecting the third direction is a fourth direction;
at least part of the plurality of touch leads are distributed on two sides of the first display region in the fourth direction, respectively.

16. A touch display apparatus, comprising:
the touch display panel according to claim 1.

17. The touch display panel according to claim 11, wherein the plurality of touch electrodes include:
a plurality of first touch electrodes that are arranged at intervals along a first direction and all extend along a second direction intersecting the first direction, the plurality of first touch electrodes being located in the first conductive layer; and
a plurality of second touch electrodes that are arranged at intervals along the second direction and all extend along the first direction;
wherein the plurality of second touch electrodes and the plurality of first touch electrodes cross each other and are insulated from each other, so as to constitute a capacitor unit at each crossing position; and a minimum closed pattern region where all capacitor units are located as a whole is the first display region;
a second touch electrode in the plurality of second touch electrodes includes:
a plurality of touch sub-electrodes that are arranged at intervals and are located in the first conductive layer; and a plurality of bridging portions located in the second conductive layer, wherein a bridging portion in the plurality of bridging portions crosses a first touch electrode in the plurality of first touch electrodes and is electrically connected to two adjacent touch sub-electrodes in the plurality of touch sub-electrodes through second via holes in the insulating layer.

18. The touch display panel according to claim 1, wherein for each of the plurality of touch leads, a terminal is located in the first display region and electrically connected to a touch electrode in the plurality of touch electrodes, and another terminal of the touch lead away from the touch electrode extends to the fan-out area; lengths of portions, located in fan-out area, of any two touch leads in the plurality of touch electrodes are substantially equal.

19. The touch display panel according to claim 1, wherein a first included angle exists between the first leading-out line and an end of the touch electrode proximate to the first leading-out line, and the first included angle is an acute angle.

* * * * *